United States Patent
Kondo

(10) Patent No.: US 10,863,132 B2
(45) Date of Patent: Dec. 8, 2020

(54) SOLID-STATE IMAGE PICKUP DEVICE AND IMAGE PICKUP APPARATUS

(71) Applicant: OLYMPUS CORPORATION, Hachioji (JP)

(72) Inventor: Toru Kondo, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 16/411,596

(22) Filed: May 14, 2019

(65) Prior Publication Data
US 2019/0268559 A1  Aug. 29, 2019

Related U.S. Application Data

(63) Continuation of application No. PCT/JP2016/084263, filed on Nov. 18, 2016.

(51) Int. Cl.
*H04N 5/378* (2011.01)
*H01L 27/146* (2006.01)
(Continued)

(52) U.S. Cl.
CPC .......... *H04N 5/378* (2013.01); *H01L 27/146* (2013.01); *H04N 5/353* (2013.01); *H04N 5/369* (2013.01);
(Continued)

(58) Field of Classification Search
CPC ...... H04N 5/378; H04N 5/369; H04N 5/3698; H04N 5/353; H04N 5/3765; H01L 27/146
See application file for complete search history.

(56) References Cited

U.S. PATENT DOCUMENTS

| 2011/0221931 A1* | 9/2011 | Wakabayashi ........... G01K 7/01 348/229.1 |
| 2012/0182450 A1 | 7/2012 | Sato et al. |
| 2015/0190093 A1* | 7/2015 | Chang .................... A61B 5/021 600/301 |

FOREIGN PATENT DOCUMENTS

| JP | 2002-118791 A | 4/2002 |
| JP | 2003-219274 A | 7/2003 |

(Continued)

OTHER PUBLICATIONS

International Search Report dated Dec. 13, 2016, issued in counterpart International Application No. PCT/JP2016/084263, w/English translation (4 pages).

*Primary Examiner* — Ahmed A Berhan
(74) *Attorney, Agent, or Firm* — Westerman, Hattori, Daniels & Adrian, LLP

(57) ABSTRACT

A solid-state image pickup device includes: a pixel array in which a plurality of pixels each outputting a photoelectric conversion signal are disposed; a reference voltage generator that generates a temperature detection voltage changing in accordance with a change in temperature and a reference voltage not depending on a change in temperature; a read circuit that performs signal processing of the photoelectric conversion signal output by the pixel array and the temperature detection voltage generated by the reference voltage generator and reads the photoelectric conversion signal and the temperature detection voltage that are processed; an output circuit that outputs both the photoelectric conversion signal and the temperature detection voltage for which the signal processing has been performed by the read circuit to the outside; and a bias generator that supplies a bias voltage generated based on the reference voltage to both the read circuit and the output circuit.

8 Claims, 8 Drawing Sheets

(51) Int. Cl.
*H04N 5/369* (2011.01)
*H04N 5/353* (2011.01)
*H04N 5/376* (2011.01)

(52) U.S. Cl.
CPC ......... *H04N 5/3698* (2013.01); *H04N 5/3765* (2013.01)

(56) References Cited

FOREIGN PATENT DOCUMENTS

| | | |
|---|---|---|
| JP | 2007-306508 A | 11/2007 |
| JP | 2011-188224 A | 9/2011 |
| JP | 2012-151664 A | 8/2012 |
| WO | 2011/132393 A1 | 10/2011 |

* cited by examiner

SOLID-STATE IMAGE PICKUP DEVICE AND IMAGE PICKUP APPARATUS

CROSS REFERENCE TO RELATED APPLICATIONS

This application is a continuation application based on a PCT Patent Application No. PCT/JP2016/084263, filed on Nov. 18, 2016, the content of which is incorporated herein by reference.

BACKGROUND

Technical Field

The present invention relates to a solid-state image pickup device and an image pickup apparatus.

Background Art

Conventionally, as a system of an image pickup apparatus, for example, there are systems used in a high-temperature environment such as an industrial endoscope apparatus. In such a system of an image pickup apparatus (hereinafter, referred to as an "image pickup system"), a temperature sensor is mounted in an image pickup unit, and a notification based on a temperature detected by this temperature sensor may be transmitted to a user of the image pickup system. For example, in an image pickup system in which a temperature sensor is mounted, in a case in which an image pickup environment has a high temperature or the like, a notification such as issuance of a warning is performed.

In addition, conventionally, for example, as disclosed in Japanese Unexamined Patent Application First Publication No. 2002-118791 (hereinafter referred to as Patent Document 1) and Japanese Unexamined Patent Application, First Publication No. 2003-219274 (hereinafter referred to as Patent Document 2), solid-slate image pickup devices (image sensors) m which a temperature sensor is mounted are also proposed.

In an image sensor in which a temperature sensor is mounted disclosed in Patent Document 1, a temperature detection signal representing a temperature of the image sensor detected by the temperature sensor is output after pixel signals output in a time series by pixels included in the image sensor.

In addition, in a solid-state image pickup device in which a temperature sensor is mounted disclosed in Patent Document 2, an output terminal used for outputting a temperature signal representing a temperature detected by the temperature sensor and an output terminal used by a pixel included in the solid-state image pickup device for outputting a pixel signal are shared, whereby a decrease in the size of the solid-state image pickup device is achieved.

In this way in a solid-state image pickup device in which a temperature sensor is mounted as disclosed in Patent Document 1 or Patent Document 2, a temperature signal representing a temperature detected by the temperature sensor when image pickup is performed by the solid-state image pickup device, and more specifically, a signal according to detection of a temperature of a semiconductor substrate in which the solid-state image pickup device is formed can be output to the outside of the solid-state image pickup device.

In an image pickup system including a solid-state image pickup device in which a temperature sensor is mounted as disclosed in Patent Document 1 or Patent Document 2, a temperature signal detected and output by the temperature sensor can be used for correcting a captured image, determination on unexpected stopping of an imaging operation, and the like.

For this reason, in a case in which a temperature sensor is mounted in a solid-state image pickup device, it is preferable that the mounted temperature sensor should detect a temperature of a semiconductor substrate in a broader range and output a temperature signal representing the detected temperature of the semiconductor substrate.

SUMMARY

A solid-state image pickup device includes: a pixel array in which a plurality of pixels each outputting a photoelectric conversion signal corresponding to an amount of incident light are disposed in a matrix pattern; a reference voltage generator configured to generate a temperature detection voltage changing in accordance with a change in temperature and a reference voltage not depending on a change in temperature; a read circuit configured to perform signal processing of the photoelectric conversion signal output by the pixel array and the temperature detection voltage generated by the reference voltage generator and read the photoelectric conversion signal and the temperature detection voltage that are processed; an output circuit configured to output both the photoelectric conversion signal and the temperature detection voltage for which the signal processing has been performed by the read circuit to the outside; and a bias generator configured to generate a bias voltage based on the reference voltage and supply the bias voltage to both the read circuit and the output circuit.

The read circuit may include an AD conversion circuit configured to convert an input analog signal into a digital signal and output the converted digital signal, and the output circuit serializes the digital signal and outputs the serialized digital signal as a differential signal.

The solid-state image pickup device may further include: a timing generator configured to control a timing for reading the photoelectric conversion signal from the pixel array and a riming for the signal processing performed by the read circuit and leading the photoelectric conversion signal and the temperature detection voltage for which the signal processing has been performed.

The solid-state image pickup device may further include: a sensor controller configured to control the timing generator and the bias generator.

The solid-state image pickup device may further include: a temperature feedback circuit configured to output a feedback signal used for changing settings of the timing generator and the bias generator to the sensor controller based on a value of the temperature detection voltage.

The output circuit may include an interface configured to be capable of switching between an output mode in which both the photoelectric conversion signal and the temperature detection voltage are output to the outside and an input mode in which a signal from the outside is input to the sensor controller.

The sensor controller may perform control of the timing generator such that the switching between the output mode and the input mode in the interface is performed before the output of the photoelectric conversion signal starts after end of the output of the temperature detection voltage.

An image pickup apparatus includes: a solid-state image pickup device; an exposure control device configured to control the amount of light incident to the solid-state image pickup device; and an imaging controller confirmed to output a control signal used for controlling the exposure control device and the solid-state image pickup device. The solid-slate image pickup device includes: a pixel array in which a plurality of pixels each outputting a photoelectric conversion signal corresponding to an amount of incident light are disposed in a matrix pattern; a reference voltage generator configured to generate a temperature detection voltage changing in accordance with a change in temperature and a reference voltage not depending on a change in temperature; a read circuit configured to perform signal processing of the photoelectric conversion signal output by the pixel array and the temperature detection voltage generated by the reference voltage generator and read the photoelectric conversion signal and the temperature detection voltage that are processed; an output circuit configured to output both the photoelectric conversion signal and the temperature detection voltage for winch the signal processing has been performed by the read circuit to the outside; a bias generator configured to generate a bias voltage based on the reference voltage and supply the bias voltage to both the read circuit and the output circuit; a timing generator configured to control a timing for reading the photoelectric conversion signal from the pixel array and a timing for the signal processing performed by the read circuit and reading the photoelectric conversion signal and the temperature detection voltage for which the signal processing has been performed; and a sensor controller configured to control the timing generator and the bias generator. The control signal output from the imaging controller is input to the sensor controller.

An image pickup apparatus includes: a solid-state image pickup device; an exposure control device configured to control the amount of light incident to the solid-state image pickup device; and an imaging controller configured to output a control signal used for controlling the exposure control device and the solid-state image pickup device. The solid-state image pickup device includes: a pixel array in winch a plurality of pixels each outputting a photoelectric conversion signal corresponding to an amount of incident light are disposed in a matrix pattern; a reference voltage generator configured to generate a temperature detection voltage changing in accordance with a change in temperature and a reference voltage not depending on a change in temperature; a read circuit configured to perform signal processing of the photoelectric conversion signal output by the pixel array and the temperature detection voltage generated by the reference voltage generator and read the photoelectric conversion signal and the temperature detection voltage that are processed; an output circuit configured to output both the photoelectric conversion signal and the temperature detection voltage for which the signal processing has been performed by the read circuit to the outside; a bias generator configured to generate a bias voltage based on the reference voltage and supply the bias voltage to both the read circuit and the output circuit; a timing generator configured to control a timing for reading the photoelectric conversion signal from the pixel array and a timing for the signal processing performed by the read circuit and reading the photoelectric conversion signal and the temperature detection voltage for which the signal processing has been performed; and a sensor controller configured to control the timing generator and the bias generator. The output circuit includes an interface configured to be capable of switching between an output mode in which both the photoelectric conversion signal and the temperature detection voltage are output to the outside and an input mode in which a signal from the outside is input to the sensor controller. In the input mode, the control signal output from the imaging controller is input to the sensor controller.

The sensor controller may perform control of the timing generator such that the switching between the output mode and the input mode in the interface is performed before the output of the photoelectric conversion signal starts after end of the output of the temperature detection voltage.

DETAILED DESCRIPTION OF THE PREFERRED EMBODIMENTS

First Embodiment

Figure 1:
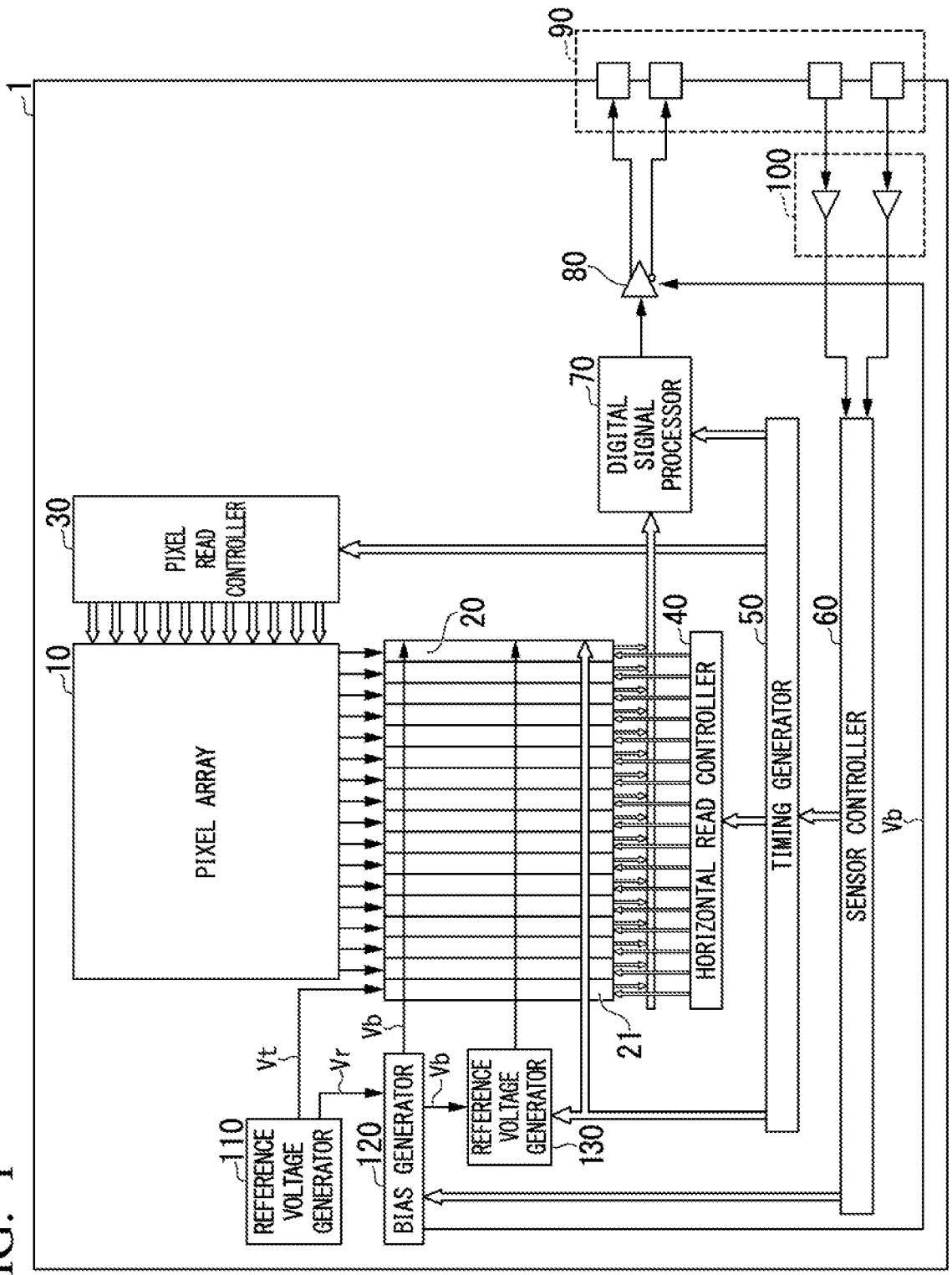
FIG. 1 is a block diagram showing a schematic configuration of a solid-state image pickup device according to a first embodiment of the present invention.

Hereinafter, an embodiment of the present invention will be described with reference to the drawings. FIG. 1 is a block diagram showing a schematic configuration of a solid-state image pickup device according to a first embodiment of the present invention. The solid-slate image pickup device 1 shown in FIG. 1 includes a pixel array 10, a plurality of column analog-to-digital (AD) conversion circuits 20, a temperature AD conversion circuit 21, a pixel read controller 30, a horizontal read controller 40, a timing generator 50, a sensor controller 60, a digital signal processor 70, an output circuit 80, an interface 90, an input circuit 100, a reference voltage generator 110, a bias generator 120, and a reference voltage generator 130.

In the pixel array 10, a plurality of pixels are disposed in a two-dimensional matrix pattern. Each of the pixels disposed in the pixel array 10, for example, includes a photoelectric conversion device such as a photodiode, and the photoelectric conversion device included in each of the pixels generates a photoelectric conversion signal according to the amount of light incident within a constant accumulation time (an exposure time). Then, the pixel array 10 outputs a pixel signal according to a photoelectric conversion signal generated by each of the pixels to a corresponding column AD conversion circuit 20 for each row of the pixels disposed in the pixel array 10 in accordance with read control from the pixel read controller 30.

The pixel read controller 30 generates an exposure signal for causing exposure to be performed for each of the pixels disposed within the pixel array 10 in accordance with a control timing signal output from the timing generator 50. Then, the pixel read controller 30 outputs the generated exposure signal to each of the pixels disposed within the pixel array 10, thereby causing exposure to be performed for each of the pixels. In addition, the pixel read controller 30 generates a read control signal for reading a pixel signal from each of the pixels disposed within the pixel array 10 in accordance with the control timing signal output from the timing generator 50. Then, the pixel read controller 30 outputs the generated read control signal for each row of the pixel array 10 and outputs pixel signals of pixels disposed in each row to the column AD conversion circuits 20.

The reference voltage generator 110 generates a reference voltage Vr for operating each constituent element included in the solid-state image pickup device 1 and a temperature detection voltage Vt for detecting a temperature of the solid-state image pickup device 1 (the semiconductor substrate). In addition, in the solid-state image pickup device 1, the reference voltage generator 110 is configured by a band gap reference circuit using a bipolar transistor. By using this configuration, the reference voltage generator 110 generates a reference voltage Vr for which a temperature coefficient becomes an almost zero voltage value and a temperature detection voltage Vt of a voltage value having a temperature coefficient according to the temperature of the solid-state image pickup device 1 with a small circuit scale. Here, the temperature detection voltage Vt generated by the reference voltage generator 110, as described above, is a voltage having a temperature coefficient according to the temperature of the solid-state image pickup device 1 and is responsible for a temperature signal output by the temperature sensor. In other words, the reference voltage generator 110 also has a function of a temperature sensor. The reference voltage generator 110 outputs (supplies) the reference voltage Vr and the temperature detection voltage Vt that have been generated to respective corresponding constituent elements. More specifically, the reference voltage generator 110 outputs the generated reference voltage Vr to the bias generator 120. In addition, the reference voltage generator 110 outputs the generated temperature detection voltage Vt to the temperature AD conversion circuit 21.

The bias generator 120 generates a bias voltage Vb for operating constituent elements included in the solid-state image pickup device 1. More specifically, the bias generator 120 generates a bias voltage Vb of a voltage value according to a control signal output from the sensor controller 60 based on the reference voltage Vr output from the reference voltage generator 110. The bias generator 120 outputs the generated bias voltage Vb to the column AD conversion circuit 20, the temperature AD conversion circuit 21, the output circuit 80, and the reference voltage generator 130.

The reference voltage generator 130 generates a reference voltage based on the bias voltage Vb output from the bias generator 120 that is referred to when the column AD conversion circuit 20 and the temperature AD conversion circuit 21 perform analog-to-digital conversion in accordance with a control timing signal output from the timing generator 50. In addition, the reference voltage generated by the reference voltage generator 130 is an analog voltage signal in which a voltage value of the bias voltage Vb monotonously changes (decreases or increases) at a constant rate with respect to time from a timing at which the column AD conversion circuit 20 and the temperature AD conversion circuit 21 start analog-to-digital conversion, a so-called a voltage signal having a ramp waveform. The reference voltage generator 130 outputs the generated reference voltage to the column AD conversion circuit 20 and the temperature AD conversion circuit 21.

In addition, in the solid-state image pickup device 1 shown in FIG. 1, a configuration in which one bias generator 120 and one reference voltage generator 130 that are common to all the column AD conversion circuits 20 and the temperature AD conversion circuit 21 are included is shown.

A column AD conversion circuit 20 is an AD conversion circuit that performs analog-to-digital conversion of a pixel signal (analog signal) output from pixels of a corresponding column disposed in the pixel array 10. The column AD conversion circuit 20 performs analog-to-digital conversion of a pixel signal based on a bias voltage Vb output from the bias generator 120, a reference voltage output from the reference voltage generator 130, and a control timing signal output from the timing generator 50. In other words, the column AD conversion circuit 20 performs analog-to-digital conversion based on a bias voltage Vb generated from a reference voltage Vr of which a temperature coefficient with respect to the temperature of the solid-state image pickup device 1 is almost zero (a degree of dependency on temperature is very low, or there is no dependency on temperature) and a reference voltage, thereby performing analog-to-digital conversion of the pixel signal in a stable state. In the solid-state image pickup device 1 shown in FIG. 1, a plurality of column AD conversion circuits 20 corresponding to the number of columns of the pixels disposed in the pixel array 10 are included. Each column AD conversion circuit 20 sequentially outputs digital data (parallel digital data) of a digital value corresponding to the amplitude of a pixel signal that has been converted from analog to digital to the digital signal processor 70 in accordance with read control from the horizontal read controller 40. In other words, each column AD conversion circuit 20 sequentially outputs parallel digital data (hereinafter referred to as "pixel data") representing the amount of light exposed to each pixel disposed in the pixel array 10 to the digital signal processor 70.

The temperature AD conversion circuit 21 is an AD conversion circuit having the same configuration as that of the column AD conversion circuit 20. However, the temperature AD conversion circuit 21 performs analog-to-digital conversion of a temperature detection voltage Vt (analog voltage) output from the reference voltage generator 110 as a temperature signal of defecting the temperature of the solid-state image pickup device 1 instead of a pixel signal for which analog-to-digital conversion is performed by the column AD conversion circuit 20. The temperature AD conversion circuit 21, similar to the column AD conversion circuit 20, performs analog-to-digital conversion of a temperature detection voltage Vt based on the bias voltage Vb output from the bias generator 120, the reference voltage output from the reference voltage generator 130, and the control timing signal output from the timing generator 50. In other words, the temperature AD conversion circuit 21, similar to the column AD conversion circuit 20, performs analog-to-digital conversion of the temperature detection voltage Vt in a stable state based on the reference voltage Vt not depending on the temperature of the solid-state image pickup device 1 (the temperature coefficient is almost zero). The temperature AD conversion circuit 21 outputs digital date (parallel digital data) of a digital value according to the amplitude of the temperature detection voltage Vt that has been converted from analog to digital to the digital signal processor 70 in accordance with read control from the horizontal read controller 40. In other words, the temperature AD conversion circuit 21 outputs parallel digital data (hereinafter, referred to as "temperature data") representing the temperature of the solid-state image pickup device 1 represented by the temperature detection voltage Vt output by the reference voltage generator 110 to the digital signal processor 70.

The timing generator 50 generates a control timing signal used for controlling timings at which constituent elements included in the solid-state image pickup device 1 operate in accordance with control from the sensor controller 60. The timing generator 50 outputs the generated control timing signal to the constituent elements included in the solid-state image pickup device 1. More specifically, the timing generator 50 generates and outputs a control timing signal for controlling timings at which the column AD conversion circuit 20, the temperature AD conversion circuit 21, the pixel read controller 30, the horizontal read controller 40, the digital signal processor 70 and the reference voltage generator 130 included in the solid-state image pickup device 1 operate.

More specifically, the timing generator 50 outputs a control timing signal used for controlling a timing at which a photoelectric conversion signal is generated by exposing incident light to each pixel disposed within the pixel array 10 and a timing at which a generated photoelectric conversion signal is read as a pixel signal to the pixel read controller 30. When a control timing signal representing a timing at which a photoelectric conversion signal is generated by exposing with incident light is input from the timing generator 50, the pixel read controller 30 performs exposure by outputting an exposure signal used for causing exposure to be performed for each pixel disposed within the pixel array 10 to each pixel. In addition, when a control timing signal representing a timing at which a pixel signal is read from each pixel disposed within the pixel array 10 is input from the timing generator 50, the pixel read controller 30 causes each pixel disposed within the pixel array 10 to output a pixel signal by outputting a read control signal used for reading a pixel signal from each pixel for each row of the pixel array 10.

In addition, the timing generator 50 outputs a control timing signal used for controlling a timing at which each of the column AD conversion circuit 20 and the temperature AD conversion circuit 21 starts analog-to-digital conversion and a reference timing at the time of performing analog-to-digital conversion to the reference voltage generator 130, the column AD conversion circuit 20, and the temperature AD conversion circuit 21. When a control timing signal representing a timing at which each of the column AD conversion circuit 20 and the temperature AD conversion circuit 21 starts analog-to-digital conversion is input from the timing generator 50, the reference voltage generator 130 starts generation of a reference voltage and outputs the generated reference voltage to the column AD conversion circuit 20 and the temperature AD conversion circuit 21. When a control timing signal representing a timing at which analog-to-digital conversion is started is input from the timing generator 50, each of the column AD conversion circuit 20 and the temperature AD conversion circuit 21 starts analog-to-digital conversion and performs analog-to-digital conversion of an input signal that is a target for analog-to-digital conversion (a pixel signal or a temperature detection voltage Vt) based on a control timing signal representing a reference timing at the time of performing analog-to-digital conversion.

In addition, the timing generator 50 outputs a control timing signal used for controlling a timing at winch digital data converted from analog to digital by each of the column AD conversion circuit 20 and the temperature AD conversion circuit 21 is read to the horizontal read controller 40. In addition, the timing generator 50 outputs a control timing signal used for controlling a timing at which a process is performed for digital data sequentially read from each of the column AD conversion circuit 20 and the temperature AD conversion circuit 21 by the horizontal read controller 40 to the digital signal processor 70.

The horizontal read controller 40 generates a read control signal for reading digital data (pixel data) acquired by each column AD conversion circuit 20 through analog-to-digital conversion and digital data (temperature data) acquired by the temperature AD conversion circuit 21 through analog-to-digital conversion in accordance with a control timing signal output from the timing generator 50. The horizontal read controller 40 outputs the generated read control signal to each of the column AD conversion circuit 20 and the temperature AD conversion circuit 21 and causes digital data acquired by each AD conversion circuit through analog-to-digital conversion to be sequentially output to the digital signal processor 70.

The digital signal processor 70 performs digital data processing set in advance for digital data sequentially output from each of the column AD conversion circuit 20 and the temperature AD conversion circuit 21 under the control of the horizontal read controller 40 in accordance with a control riming signal output from the timing generator 50. In other words, the digital signal processor 70 performs digital data processing for digital data (pixel data) acquired by each column AD conversion circuit 20 through analog-to-digital conversion and digital data processing for digital data (temperature data) acquired by the temperature AD conversion circuit 21 through analog-to-digital conversion. In the digital data processing performed by the digital signal processor 70, digital data processing such as serialization processing of converting parallel digital data output from each of the column AD conversion circuit 20 and the temperature AD conversion circuit 21, in other words, digital data composed of data of a plurality of bits into digital data composed of data of one bit, in other words serial digital data or the like is included. The digital signal processor 70 outputs digital data (serial digital data) after the digital data processing to the output circuit 80.

In addition, the digital signal processor 70 performs various kinds of digital data processing in addition to the serialization processing of parallel digital data output from each of the column AD conversion circuit 20 and the temperature AD conversion circuit 21 described above. For example, the digital signal processor 70 performs digital data processing of generating a clock signal, a synchronization signal, and the like required for converting (returning) serial digital data converted through the serialization process into parallel digital data again, in other words, performing a process of restoring the parallel digital data output from each of the column AD conversion circuit 20 and the temperature AD conversion circuit 21.

The output circuit 80 is a differential buffer circuit that converts digital data (serial digital data) output from the digital signal processor 70 into a differential signal based on the bias voltage Vb output from the bias generator 120. The output circuit 80 outputs each converted differential signal to the outside of the solid-slate image pickup device 1 through a corresponding interface 90. The output circuit 80, for example, converts serial digital data output from the digital signal processor 70 into a differential signal corresponding to a differential interface system such as a low voltage differential signaling (LVDS) system. In such a case, the output circuit 80 converts data into a differential signal of the LVDS system corresponding to pixel data for which the serialization processing has been performed by the digital signal processor 70 (hereinafter, referred to as a "pixel data signal") and a differential signal of the LVDS system corresponding to temperature data for which the serialization processing has been performed by the digital signal processor 70 (hereinafter, referred to as a "temperature data signal"). Then, the output circuit 80 outputs the converted differential signals of the LVDS system to the outside of the solid-state image pickup device 1 through corresponding interfaces 90. In addition, the output circuit 80 also performs termination processing of the LVDS system and the like.

The interface 90 is a terminal used for connecting the solid-state image pickup device 1 to the outside. In the solid-state image pickup device 1 shown in FIG. 1, the interface 90 having a configuration including two output terminals for outputting differential signals output by the output circuit 80 to the outside and two input terminals for inputting signals from the outside to the solid-state image pickup device 1 is shown. In the solid-state image pickup device 1, by configuring an output terminal for a pixel data signal and an output terminal for a temperature data signal to be shared, a decrease in the size (a projection area) of a semiconductor substrate forming the solid-state image pickup device 1 is achieved.

The input circuit 100 is a buffer circuit used for transmitting a signal input from outside of the solid-state image pickup device 1 to the sensor controller 60. In the solid-state image pickup device 1 shown in FIG. 1, the input circuit 100 having a configuration including two buffer circuits corresponding to two input terminals is shown. The input circuit 100 outputs signals input from outside of the solid-state image pickup device 1 through corresponding interfaces 90 to the sensor controller 60. For example, in a case in which an external constituent element of the solid-state image pickup device 1, for example, inputs a signal (for example, a command signal, a selling signal, or the like) used for controlling the operation of the solid-state image pickup device 1 through serial communication using an inter-integrated circuit (I2C) bus, signals of the I2C serial communication are input to the input circuit 100 from outside of the solid-state image pickup device 1 through corresponding interfaces 90. The input circuit 100 outputs the input signals of the I2C serial communication to the sensor controller 60.

The sensor controller 60 controls the overall operation of the solid-state image pickup device 1 in accordance with a signal input from outside of the solid-state image pickup device 1. The sensor controller 60 outputs control signals used for controlling the operations of constituent elements included in the solid-state image pickup device 1 to the constituent elements. More specifically, the sensor controller 60 outputs control signals used for controlling the operations of the timing generator 50 and the bias generator 120 included in the solid-state image pickup device 1 in accordance with a signal input from outside of the solid-state image pickup device 1.

Here, a control signal output by the sensor controller 60 to the timing generator 50 is a control signal used for controlling an imaging operation in the solid-state image pickup device 1. More specifically, in a case in which a command signal directing execution of imaging using the solid-state image pickup device 1 is input from outside of the solid-state image pickup device 1 through an input terminal of the interface 90 and the input circuit 100, the sensor controller 60 outputs a control signal representing execution of an imaging operation to the timing generator 50. In this way, the timing generator 50 outputs a control timing signal used for controlling timings for exposure using each pixel disposed in the pixel array 10 and reading a pixel signal to the pixel read controller 30. In addition, the timing generator 50 outputs a control timing signal for analog-to-digital conversion of a pixel signal (analog signal) output from the pixel array 10 to the reference voltage generator 130 and the column AD conversion circuit 20. In addition, the timing generator 50 outputs a control timing signal used for controlling a timing for reading pixel data that has been converted from analog to digital by each column AD conversion circuit 20 to the horizontal read controller 40. In addition, the timing generator 50 outputs a control liming signal used for controlling a timing at which digital data processing (serialization processing) is performed for pixel data sequentially read from each column AD conversion circuit 20 using the horizontal read controller 40 to the digital signal processor 70. In accordance with control of timings for the constituent elements using the timing generator 50, the solid-state image pickup device 1 outputs a pixel data signal corresponding to the amount of exposure of each pixel disposed in the pixel array 10 to the outside of the solid-state image pickup device 1 through the output circuit 80 and the output terminal of the interface 90.

In addition, a control signal output by the sensor controller 60 to the timing generator 50 is a control signal that is used for controlling an operation of temperature detection that is performed by the solid-state image pickup device 1. More specifically, in a case in which a command signal directing detection of a temperature of the solid-state image pickup device 1 is input from outside of the solid-state image pickup device 1 through the input terminal of the interface 90 and the input circuit 100, the sensor controller 60 outputs a control signal representing execution of an operation of temperature detection to the timing generator 50. Accordingly, the timing generator 50 outputs a control timing signal for performing analog-to-digital conversion of a temperature detection voltage Vt (analog voltage) output by the reference voltage generator 110 to the reference voltage generator 130 and the temperature AD conversion circuit 21. In addition, the timing generator 50 outputs a control timing signal used for controlling a timing for reading temperature data that has been converted from analog to digital by the temperature AD conversion circuit 21 to the horizontal read controller 40. Furthermore, the timing generator 50 outputs a control timing signal used for controlling a timing at which digital data processing (serialization processing) is performed for temperature data read from the temperature AD conversion circuit 21 by the horizontal read controller 10 to the digital signal processor 70. In accordance with control of timings for the constituent elements using the timing generator 50, the solid-state image pickup device 1 outputs a voltage value of the temperature detection voltage Vt having a temperature coefficient according to the temperature of the solid-state image pickup device 1 output by the reference voltage generator 110 through the output circuit 80 and the output terminal of the interface 90, in other words, a temperature data signal representing the current temperature of the solid-state image pickup device 1 to the outside of the solid-state image pickup device 1.

In addition, even in a case in which both a command signal directing execution of imaging using the solid-state image pickup device 1 and a command signal directing detection of the temperature of the solid-state image pickup device 1 are input from outside of the solid-state image pickup device 1, in accordance with a control signal output to the timing generator 50, the sensor controller 60 can output a pixel data signal according to the amount of exposure of each pixel disposed in the pixel array 10 and a temperature data signal representing the current temperature of the solid-state image pickup device 1 to the outside of the solid-state image pickup device 1. For example, simultaneously with analog-to-digital conversion of a pixel signal of each row output from the pixel array 10, the sensor controller 60 outputs a control signal for controlling execution of analog-to-digital conversion of the temperature detection voltage Vt output by the reference voltage generator 110 to the timing generator 50. In addition, following the reading of pixel data that has been converted from analog to digital by each column AD conversion circuit 20, the sensor controller 60 outputs a control signal for performing control such that temperature data that has been converted from analog to digital by the temperature AD conversion circuit 21 is read to the timing generator 50. In this way, following a pixel data signal output for each row of pixels disposed in the pixel array 10, the solid-state image pickup device 1 can output a temperature data signal representing the current temperature of the solid-state image pickup device 1 to the outside of the solid-state image pickup device 1. In other words, for every period until a pixel data signal of the next row is output after a pixel data signal of a certain row of the pixel array 10 is output (so called, a horizontal period), the solid-state image pickup device 1 can output a temperature data signal to the outside of the solid-state image pickup device 1

In addition, a control signal output to the bias generator 120 by the sensor controller 60 is a control signal used for controlling a voltage value of the bias voltage Vb generated by the bias generator 120. More specifically, in a case in which a setting signal representing setting and a set value of the bias voltage Vb of the solid-state image pickup device 1 is input from the outside of the solid-state image pickup device 1 through the input terminal of the interface 90 and the input circuit 100, the sensor controller 60 outputs a control signal representing execution of an operation of setting the voltage value of the bias voltage Vb to the input set value to the bias generator 120. Accordingly, the bias generator 120 generates a bias voltage Vb of a voltage value according to the set value input from the sensor controller 60 based on the reference voltage Vr output from the reference voltage generator 110 and outputs the generated bias voltage Vb to the constituent elements. Then, the constituent elements operate based on the bias voltage Vb output from the bias generator 120. In other words, each of the column AD conversion circuit 20, the temperature AD conversion circuit 21, the output circuit 80, and the reference voltage generator 130 included in the solid-state image pickup device 1 performs (lie operation of imaging or temperature detection described above based on the bias voltage Vb output from the bias generator 120. In this way, the solid-state image pickup device 1 outputs a pixel data signal and a temperature data signal based on the bias voltage Vb of a voltage value set from the outside to the outside of the solid-state image pickup device 1.

In this way, the solid-state image pickup device 1 according to the first embodiment includes the reference voltage generator 110 that generates a reference voltage Vr, of which the temperature coefficient is almost zero, not depending on the temperature of the solid-state image pickup device 1 (not being influenced by the effect of the temperature of the solid-state image pickup device 1) and a temperate detection voltage Vt of a voltage value changing in accordance with the temperature of the solid-state image pickup device 1 (having a temperature coefficient according to the temperature). Then, in the solid-state image pickup device 1 according to the first embodiment, the column AD conversion circuit 20, the output circuit 80, and the reference voltage generator 130 operate based on the bias voltage Vb generated based on the reference voltage Vr generated by the reference voltage generator 110. Accordingly, the solid-state linage pickup device 1 according to the first embodiment can output a pixel data signal in a state having a low influence of the temperature of the solid-state device 1, in other words, having a low degree of dependency on the temperature.

In addition, the solid-state image pickup device 1 according to the first embodiment includes the temperature AD conversion circuit 21 having the same configuration as the column AD conversion circuit 20 performing analog-to-digital conversion of a voltage value of the temperature detection voltage Vt generated by the reference voltage generator 110. Accordingly, in the solid-slate image pickup device 1 according to the first embodiment, the temperature of the solid-state image pickup device 1 can be detected based on a voltage value of the temperature detection voltage Vt generated by the reference voltage generator 110. In addition, in the solid-state image pickup device 1 according to the first embodiment, the temperature AD conversion circuit 21 operates based on the bias voltage Vb generated based on the reference voltage Vr generated by the reference voltage generator 110. Accordingly, the solid-state image pickup device 1 according to the first embodiment can output a temperature data signal having a low influence of the temperature of the solid-state image pickup device 1, in other words, in a state having a low degree of dependency on the temperature. In other words, even in a case in which the temperature of the solid-state image pickup device 1 greatly changes, the solid-state image pickup device 1 according to the first embodiment can output a temperature data signal accurately representing the temperature of the solid-state image pickup device 1 (semiconductor substrate) represented by the voltage value of the temperature detection voltage Vt.

For example, in the solid-state image pickup device 1 according to the first embodiment, even in a case in which the temperature of the solid-state image pickup device 1 greatly changes to the high temperature side, and a pixel signal from each pixel disposed in the pixel array 10 is not normally output to a corresponding column AD conversion circuit 20 due to the influence of a dark current at the time of a high temperature, the bias voltage Vb and the reference voltage of the column AD conversion circuit 20 and the bias voltage Vb of the output circuit 80 are generated based on the reference voltage Vr having a voltage value of which the temperature coefficient is almost zero. Accordingly, in the solid-state image pickup device 1 according to the first embodiment, the column AD conversion circuit 20 and the output circuit 80 can correctly operate without being greatly influenced by the temperature of the solid-state image pickup device 1.

For example, the output circuit 80 is a circuit device operating at a high speed for converting serial digital data into a differential signal and outputting the differential signal and is a circuit device that may be easily influenced by bias variations due to variations in the temperature. However, the output circuit 80 of the solid-state image pickup device 1 according to the first embodiment can set a current value of a differential signal to be output using the bias voltage Vb generated by the basis generator 120 based on the reference voltage Vr. For this reason, in the solid-state image pickup device 1 according to the first embodiment, variations in the current value according to bias variations occurring when the temperature varies are inhibited and the signal output capability of the output circuit 80 can be maintained. In this way, the output circuit 80 of the solid-state image pickup device 1 according to the first embodiment can output a temperature data signal that accurately represents the temperature of the solid-state image pickup device 1 represented by the voltage value of the temperature detection voltage Vt to the outside of the solid-state image pickup device 1 in a broader range of temperature.

For example, in a case in which the operation guarantee temperature of the solid-state image pickup device 1 is 85° C., a current value of a differential signal to be output is set in accordance with a bias voltage having a temperature coefficient like a conventional solid-state image pickup device, the range of temperatures at which the output circuit 80 can output an accurate temperature data signal is assumed to be up to 85° C. In contrast to this, in a case in which a current value of a differential signal to be output is set in accordance with the bias voltage Vb based on the reference voltage Vt of which the temperature coefficient is almost zero, even when the operation guarantee temperature of pixels included in the pixel array 10 is 85° C., the output circuit 80, for example, like up to 125° C., can output a temperature data signal representing an accurate temperature in a range broader than that of a conventional case. In other words, the output circuit 80 can output a temperature data signal accurately representing the temperature of the solid-state image pickup device 1 (for example, 125° C.) that can be represented by a voltage value of the temperature detection voltage Vt generated by the reference voltage generator 110. In this way, in the solid-state image pickup device 1 according to the first embodiment, in a case in which an output pixel data signal comes into an invalid slate due to a certain reason, it can be determined whether or not the reason is due to an increase in the temperature.

In addition, the solid-state image pickup device 1 according to the first embodiment outputs a temperature data signal through constituent elements that are common to the constituent elements for outputting a pixel data signal, in other words, the digital signal processor 70, the output circuit 80, and the interface 90. In other words, in the solid-state image pickup device 1 according to the first embodiment, constituent elements for outputting a pixel data signal and constituent elements for outputting a temperature data signal are shared. In this way, according to the solid-state image pickup device 1 of the first embodiment, constituent elements (circuit elements) for outputting a temperature data signal representing a detected temperature to the outside of the solid-state image pickup device 1 are not additionally disposed, and an increase in the circuit scale of the solid-state image pickup device 1 can be inhibited.

Figure 2:
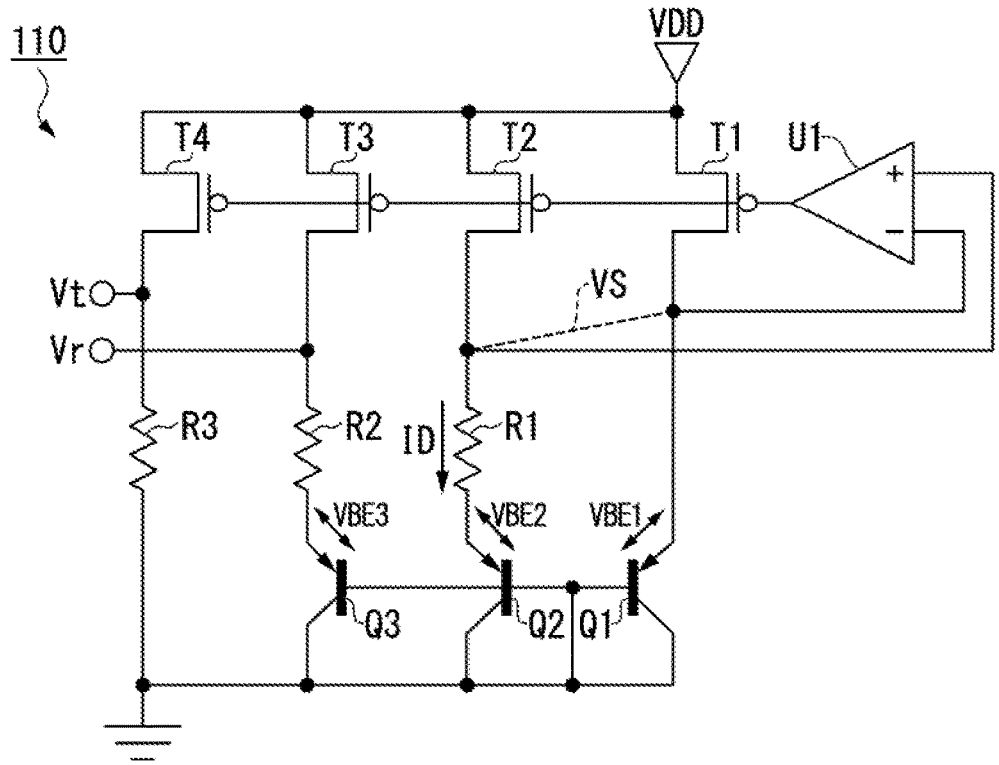
FIG. 2 is a circuit diagram showing one example of the configuration of a reference voltage generator included in the solid-state image pickup device according to the first embodiment of the present invention.

Next, one example of a more specific configuration of the reference voltage generator 110 included in the solid-state image pickup device 1 according to the first embodiment will be described. FIG. 2 is a circuit diagram showing one example of the configuration of the reference voltage generator 110 included in the solid-state image pickup device 1 according to the first embodiment of the present invention. The reference voltage generator 110 shown in FIG. 2 is composed of three bipolar transistors Q1 to Q3, three resistors R1 to R3, four field effect transistors (FETs) T1 to T4, and an operational amplifier U1.

In the reference voltage generator 110 shown in FIG. 2, an inverted input terminal of the operational amplifier U1 is connected to an emitter terminal of the bipolar transistor Q1 and one of a drain terminal and a source terminal of the field effect transistor T1. A non-inverted input terminal of the operational amplifier U1 is connected to a first terminal of the resistor R1 and one of a drain terminal and a source terminal of the field effect transistor T2. A second terminal of the resistor R1 is connected to an emitter terminal of the bipolar transistor Q2. An output terminal of the operational amplifier U1 is connected to a gate terminal of the field effect transistor T1, a gate terminal of the field effect transistor T2, a gate terminal of the field effect transistor T3, and a gate terminal of the field effect transistor T4. One of a source terminal and a drain terminal of the field effect transistor T1, one of a source terminal and a drain terminal of the field effect transistor T2, one of a source terminal and a drain terminal of the field effect transistor T3, and one of a source terminal and a drain terminal of the field effect transistor T4 are connected to a power source VDD. One of the drain terminal and the source terminal of the field effect transistor T3 is connected to a first terminal of the resistor R2 and serves as an output terminal of a reference voltage Vr in the reference voltage generator 110. A second terminal of the resistor R2 is connected to an emitter terminal of the bipolar transistor Q3. One of the drain terminal and the source terminal of the field effect transistor T4 is connected to a first terminal of the resistor R3 and serves as an output terminal of a temperature detection voltage Vt in the reference voltage generator 110. A second terminal of the resistor R3, a collector terminal and a base terminal of the bipolar transistor Q1, a collector terminal and a base terminal of the bipolar transistor Q2, and a collector terminal and a base terminal of the bipolar transistor Q3 are grounded.

In accordance with such connection, in the reference voltage generator 110 shown in FIG. 2, the electric potential of the first terminal of the resistor R1 becomes electric potential VBE1 between the base terminal and the emitter terminal of the bipolar transistor Q1 in accordance with virtual short (imaginary short) VS between the inverted input terminal and the non-inverted input terminal of the operational amplifier U1. In addition, the electric potential of the second terminal of the resistor R1 becomes electric potential VBE2 between the base terminal and the emitter terminal of the bipolar transistor Q2. In this case, a current ID flowing through the resistor R1 is represented as in the following Equation (1).

$$ID=(VBE1-VBE2)/R1=(kT/q*\ln(n))/R1 \qquad (1)$$

In Equation (1) represented above, R1 is a resistance value of the resistor R1. In addition, in Equation (1) represented above, k is a Boltzmann constant, T is an absolute temperature, and q is electric charge of electrons. In addition, in Equation (1) represented above, ln(n) represents a ratio between the bipolar transistor Q1 and the bipolar transistor Q2. In Equation (1) represented above, the ratio ln(n) between the bipolar transistor Q1 and the bipolar transistor Q2 has a positive temperature coefficient. In the reference voltage generator 110 shown in FIG. 2, the current ID represented in Equation (1) described above also flows through the resistor R2 and the resistor R3 in accordance with the field effect transistor T1, the field effect transistor T2, the field effect transistor T3, and the field effect transistor T4. In this way, a temperature detection voltage Vt that is the electric potential of the first terminal of the resistor R3 is represented as in the following Equation (2).

$$Vt = R3/R1*(kT/q*ln(n)) \quad (2)$$

In Equation (2) represented above, R3 is a resistance value of the resistor R3. In accordance with Equation (2) represented above, the temperature detection voltage Vt is a voltage that has a positive temperature coefficient and depends on the temperature, in other words, changes in accordance with the temperature.

Meanwhile, since the electric potential of the second terminal of the resistor R2 is an electric potential VBE3 between the base terminal and the emitter terminal of the bipolar transistor Q3, the reference voltage Vr that is the electric potential of the first terminal of the resistor R2 is represented as in the following Equation (3).

$$Vr = VBE3 + R2/R1*(kT/q*ln(n)) \quad (3)$$

In Equation (3) represented above, R2 is a resistance value of the resistor R2. An electric potential VBE3 represented in the first term of the right side of Equation (3) represented above has a negative temperature coefficient. For this reason, in Equation (3) represented above, the electric potential VBE3 of the first term of the right side having a negative temperature coefficient and R2/R1*(kT/q*ln(n)) of the second term of the right side having a positive temperature coefficient offset each other, and thus, the temperature detection voltage Vt becomes a voltage that does not depend on the temperature, in other words, that does not change in accordance with the temperature.

In addition, generally, the resistor also has temperature characteristics. For this reason, in the configuration of the reference voltage generator 110 shown in FIG. 2, voltage values of the temperature detection voltage Vt and the reference voltage Vt, which are output, are configured to be set in accordance with a ratio between resistors and thus are configured not to be influenced by temperature characteristics of the resistors. More specifically, the voltage value of the temperature detection voltage Vt is configured to be set in accordance with a ratio R3/R1 of the resistance values of the light side of Equation (2) represented above, and the voltage value of the reference voltage Vr is configured to be set in accordance with a ratio R2/R1 of the resistance values of the second term of the right side of Equation (3) represented above.

According to such a configuration, the reference voltage generator 110 shown in FIG. 2 generates and outputs a reference voltage Vr of which the voltage value does not change in accordance with the temperature (the temperature coefficient is almost zero) used for operating the constituent elements included in the solid-state image pickup device 1 based on the power source VDD and a temperature detection voltage Vt of which the voltage value changes in accordance with the temperature (having a temperature coefficient) used for detecting the temperature of the solid-state image pickup device 1 (semiconductor substrate).

In addition, a specific circuit configuration of the reference voltage generator 110 is not limited to the circuit configuration of the reference voltage generator 110 shown in FIG. 2. In other words, the circuit configuration of the reference voltage generator 110 may be any circuit configuration as long as a reference voltage Vr of which the voltage value does not change in accordance with the temperature (the temperature coefficient is almost zero) and a temperature detection voltage Vt of which the voltage value changes in accordance with the temperature (having a temperature coefficient) can be generated and output in the configuration.

Figure 3:
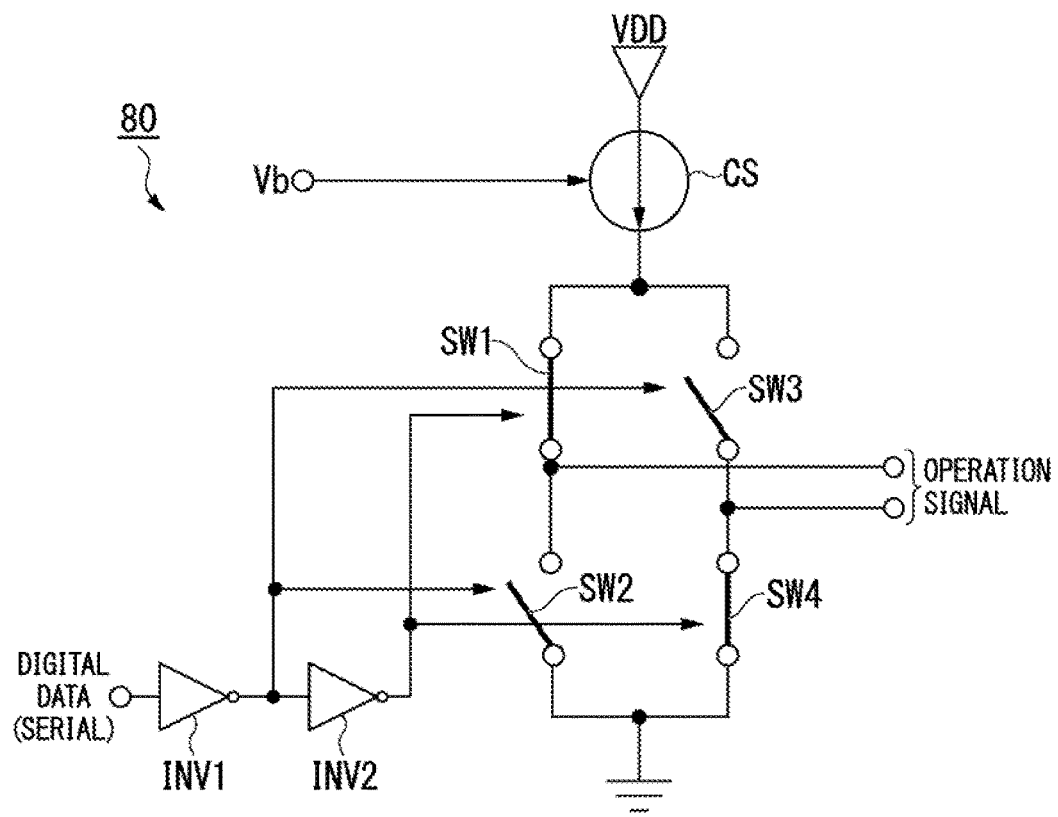
FIG. 3 is a circuit diagram showing one example of the configuration of an output circuit included in the solid-state image pickup device according to the first embodiment of the present invention.

Next, one example of a more specific configuration of the output circuit 80 included in the solid-state image pickup device 1 according to the first embodiment will be described. FIG. 3 is a circuit diagram showing one example of the configuration of the output circuit 80 included in the solid-state image pickup device 1 according to the first embodiment of the present invention. The output circuit 80 shown in FIG. 3 is composed of two inverter circuits INV1 and INV2, four switches SW1 to SW4, and a current source CS.

In the output circuit 80 shown in FIG. 3, serial digital data output from the digital signal processor 70 is input to an input terminal of the inverter circuit INV1, and an output terminal is connected to an input terminal of the inverter circuit INV2, a control terminal of the switch SW2, and a control terminal of the switch SW3. An output terminal of the inverter circuit INV2 is connected to a control terminal of the switch SW1 and a control terminal of the switch SW4. A first terminal of the switch SW1 and a first terminal of the switch SW3 are connected to an output terminal of the current source CS. An input terminal of the current source CS is connected to a power source VDD, and a bias voltage Vb output from the bias generator 120 is input to a bias terminal. A second terminal of the switch SW1 is connected to a first terminal of the switch SW2 and serves as a first output terminal of a differential signal (for example, an output terminal of a differential positive signal) in the output circuit 80. A second terminal of the switch SW3 is connected to the first terminal of the switch SW4 and serves as a second output terminal of a differential signal (for example, an output terminal of a differential negative signal) in the output circuit 80. A second terminal of the switch SW2 and a second terminal of the switch SW4 are grounded.

In accordance with such a configuration, the output circuit 80 shown in FIG. 3 outputs a differential signal representing input serial digital data from the first output terminal and the second output terminal. More specifically, the output circuit 80 outputs a differential signal (for example, a differential positive signal) representing input serial digital data from the first output terminal and outputs a differential signal (for example, a differential negative signal) representing digital data acquired by inverting digital values of the input serial digital data from the second output terminal. Here, current values of the differential signals output by the output circuit 80 from the first output terminal and the second output terminal are currents values set by the current source CS in accordance with a bias voltage Vb output from the bias generator 120. In addition, each differential signal output by the output circuit 80, as described above, is a differential signal in a state in which variations in the current value according to bias variations occurring when the temperature changes are inhibited. Then, each differential signal output by the output circuit 80 is output to the outside of the solid-state image pickup device 1 through a corresponding interface 90, more specifically, an output terminal, which is used for outputting both a pixel data signal and a temperature data signal, of the interface 90.

In addition, a specific circuit configuration of the output circuit 80 is not limited to the circuit configuration of the output circuit 80 shown in FIG. 3. In other words, the circuit configuration of the output circuit 80 may be any circuit configuration as long as input serial digital data can be output as a differential signal of a current value set in accordance with the bias voltage Vb in the circuit configuration.

According to the first embodiment, a solid-state image pickup device (the solid-state image pickup device 1) is configured which includes a pixel array (the pixel array 10) in which a plurality of pixels outputting photoelectrically converted signals according to the amount of incident light are disposed in a matrix pattern, a reference voltage generator (the reference voltage generator 110) generating a temperature detection voltage (the temperature detection voltage Vt) changing in accordance with a change in the temperature and a reference voltage (the reference voltage Vr) not depending on a change in the temperature, a read circuit (the column AD conversion circuit 20, the temperature AD conversion circuit 21, the pixel read controller 30, the horizontal read controller 40, and the reference voltage generator 130) performing signal processing and reading of a photoelectrically converted signal output by the pixel array 10 and a temperature detection voltage Vt generated by the reference voltage generator 110, an output circuit (the digital signal processor 70, the output circuit 80, and the interface 90) outputting both the photoelectrically converted signal and the temperature detection voltage Vt for which signal processing has been performed by the read circuit, and a bias generator (the bias generator 120) supplying a bias voltage (the bias voltage Vb) generated based on the reference voltage Vt to the read circuit and the output circuit.

In addition, according to the first embodiment, as the read circuit, the solid-slate image pickup device 1 including an AD conversion circuit (the column AD conversion circuit 20 and the temperature AD conversion circuit 21) that converts an input analog signal (the pixel signal or the temperature detection voltage Vt: temperature signal) into a digital signal and outputs the converted digital signal is configured.

In addition, according to the first embodiment, the solid-state image pickup device 1 including a timing generator (the timing generator 50) that controls a timing of reading a photoelectrically converted signal from the pixel array 10 and a liming of signal processing using the read circuit and reading the photoelectrically converted signal for which the signal processing has been performed and the temperature detection voltage Vt is configured.

In addition, according to the first embodiment, the solid-state image pickup device 1 including a sensor controller (the sensor controller 60) that controls the timing generator 50 and the bias generator 120 is configured.

Figure 4:
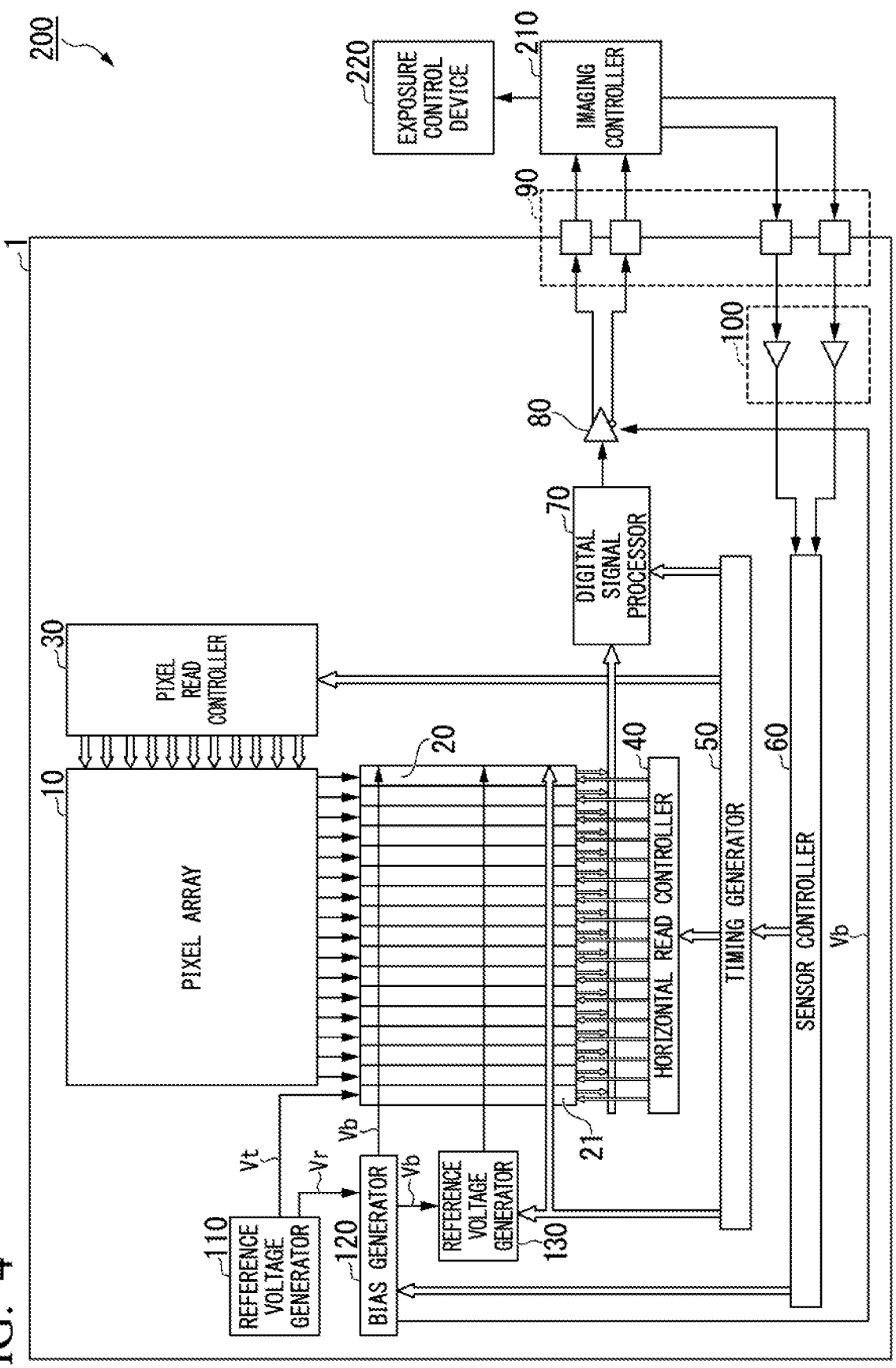
FIG. 4 is a block diagram showing a schematic configuration of an image pickup apparatus in which the solid-state image pickup device according to the first embodiment of the present invention is mounted.

Next, an image pickup apparatus in which the solid-state image pickup device 1 according to the first embodiment is mounted will be described. FIG. 4 is a block diagram showing a schematic configuration of an image pickup apparatus in which the solid-state image pickup device 1 according to the first embodiment of the present invention is mounted. The image pickup apparatus 200 shown in FIG. 4 includes the solid-slate image pickup device 1, an imaging controller 210, and an exposure control device 220.

The exposure control device 220 is s device for controlling the amount of light incident to the solid-state image pickup device 1 in accordance with control from the imaging controller 210. For example, in a case in which the image pickup apparatus 200 is a system of a digital single-lens reflex camera, the exposure control device 220 is a mechanical shutter, a diaphragm device, or the like. In addition, for example, in a case in which the image pickup apparatus 200 is a system of an endoscope apparatus, the exposure control device 220 is a light source device such as a light emitting diode (LED) light source or the like. In addition, as the exposure control device 220, one of devices of various configurations according to the system of the image pickup apparatus 200 in which the solid-state image pickup device 1 is mounted may be considered. Thus, in the present invention, the configuration of the exposure control device 220 is not particularly defined.

The imaging controller 210 is a controller that controls timings of a setting and an operation of each of the solid-state image pickup device 1 and the exposure control device 220 when imaging is performed by the image pickup apparatus 200. The imaging controller 210 controls timings of a setting and an operation of each of the solid-state image pickup device 1 and the exposure control device 220 and the like based on a pixel data signal that is imaged and output by the solid-state image pickup device 1 and a temperature data signal that is detected and output by the solid-state image pickup device 1. For example, before imaging is performed by the image pickup apparatus 200, the imaging controller 210 outputs a control signal for causing the solid-state image pickup device 1 to perform a temperature detection operation and acquires a temperature data signal detected by the solid-state image pickup device 1. Then, the imaging controller 210 determines an imaging method used by the solid-state image pickup device 1 based on the acquired temperature data signal and outputs a control signal for causing execution of an imaging operation using the determined imaging method. Accordingly the imaging controller 210 can acquire a pixel data signal on which a temperature detected by the solid-state image pickup device 1 has been detected is reflected.

Figure 5:
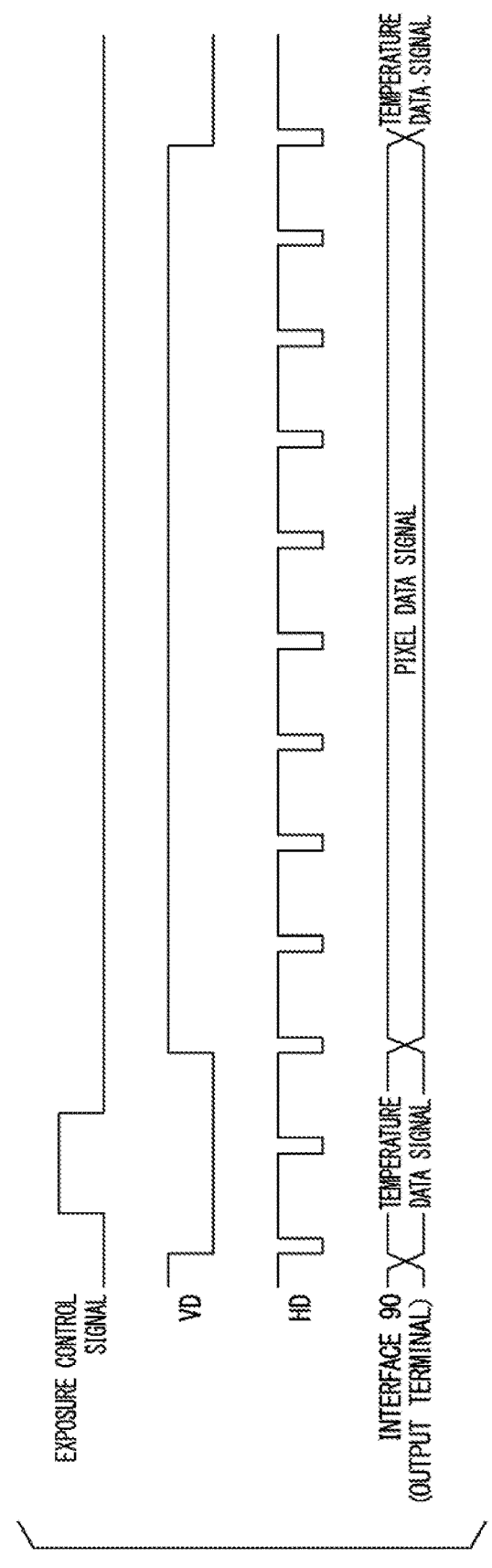
FIG. 5 is a timing diagram showing one example of signal read timings in an image pickup apparatus in which the solid-state image pickup device according to the first embodiment of the present invention is mounted.

Here, one example of a method of controlling the solid-state image pickup device 1 in the imaging controller 210 will be described. FIG. 5 is a timing diagram showing one example of signal read timings in the image pickup apparatus 200 in which the solid-state image pickup device 1 according to the first embodiment of the present invention is mounted. The timing diagram shown in FIG. 5 illustrates control timings in a case in which controlling the imaging controller 210 to acquire a temperature data signal during an exposure period in which each pixel disposed in the pixel array 10 included in the solid-state image pickup device 1 exposures incident light and acquire a pixel data signal after the end of the exposure is periodically performed in a case in which the image pickup apparatus 200, for example, is a system of an endoscope apparatus.

In FIG. 5, an exposure control signal used tor the imaging controller 210 to cause the solid-state image pickup device 1 to exposure light, a vertical synchronization signal VD and a horizontal synchronization signal HD used as references when the imaging controller 210 periodically acquires a pixel data signal and a temperature data signal from the solid-state image pickup device 1, and two output terminals (differential signals) inside the interface 90 to which the solid-state image pickup device 1 outputs a pixel data signal and a temperature data signal are shown. In addition, the timing diagram shown in FIG. 5 illustrates each signal in a period in which a pixel data signal corresponding to one frame is acquired.

In the timing diagram shown in FIG. 5, when the vertical synchronization signal VD becomes a "Low" level representing a period in which a pixel data signal is not read, in other words, when it becomes a vertical blanking period, the imaging controller 210 controls the exposure control device 220 such that light is incident to the solid-state image pickup device 1 in a period in which an exposure control signal synchronized with the vertical synchronization signal VD is in a "High" level. In addition, at this time, the imaging controller 210, for example, through I2C serial communication outputs a command signal directing execution of imaging to two input terminals of the interface 90 of the solid-state image pickup device 1 (hereinafter, referred to as an "imaging command"). Accordingly, in the solid-state image pickup device 1, an imaging command output from the imaging controller 210 through the input terminals of the interface 90 and the input circuit 100 is input to the sensor controller 60. The sensor controller 60 outputs a control signal representing execution of an exposure operation to the timing generator 50 in accordance with an imaging command input from the imaging controller 210. Accordingly, the timing generator 50 outputs a control timing signal for controlling an exposure timing using each pixel disposed in the pixel array 10 to the pixel read controller 30. Accordingly, the pixel read controller 30 performs exposure of incident light by outputting an exposure control signal to each pixel disposed in the pixel array 10.

Thereafter, when the vertical synchronization signal VD becomes the "High" level representing a period in which a pixel data signal is read, the imaging controller 210 outputs a command signal (hereinafter, referred to as a "pixel read command") directing to read a pixel data signal corresponding to a pixel signal output from each pixel at a timing synchronized with the horizontal synchronization signal HD from each row of the pixel array 10 to two input terminals of the interface 90 of the solid-state image pickup device 1, for example, through I2C serial communication. Accordingly, in the solid-state image pickup device 1, the pixel read command output from the imaging controller 210 is input to the sensor controller 60 through the input terminals of the interface 90 and the input circuit 100. The sensor controller 60 outputs a control signal representing execution of an operation of reading a pixel signal to the timing generator 50 in accordance with a pixel read command input from the imaging controller 210. Accordingly, the timing generator 50 outputs a control timing signal used for controlling a timing at which a pixel signal is read from each pixel disposed in the pixel army 10 to the pixel read controller 30. Accordingly, the pixel read controller 30 outputs a read control signal to each row of pixels disposed in the pixel array 10, thereby outputting pixel signals. In addition, toe timing generator 50 outputs a control timing signal used for controlling a timing at which analog-to-digital conversion of a pixel signal output from each pixel is started to the reference voltage generator 130 and the column AD conversion circuit 20. Accordingly, the reference voltage generator 130 outputs a reference voltage, and the column AD conversion circuit 20 performs analog-to-digital conversion of pixel signals output from pixels of a corresponding column based on the bias voltage Vb output from the bias generator 120 and the reference voltage output from the reference voltage generator 130. In addition, the liming generator 50 outputs a control liming signal used for controlling a time at which each column AD conversion circuit 20 reads pixel data that has been converted from analog to digital to the horizontal read controller 40. Accordingly, the horizontal read controller 40 sequentially reads pixel data that has been converted from analog to digital by each column AD conversion circuit 20 and outputs the read pixel data to the digital signal processor 70. In addition, the timing generator 50 outputs a control timing signal used for controlling a timing at which digital data processing is performed for pixel data (parallel digital data) sequentially read by the horizontal read controller 40 to the digital signal processor 70. Accordingly, the digital signal processor 70 outputs serial digital data acquired after performing digital data processing (serialization processing) for the pixel data that has been sequentially input to the output circuit 80. Accordingly, the output circuit 80 outputs a pixel data signal corresponding to the serial digital data output from the digital signal processor 70 to the imaging controller 210 outside of the solid-slate image pickup device 1 through the output terminal of the interface 90.

In addition, in the timing diagram shown in FIG. 5, when it becomes a vertical blanking period, the imaging controller 210 outputs a command signal directing detection of a temperature (hereinafter, referred to as a "temperature read command") to two input terminals of the interface 90 of the solid-state image pickup device 1, for example, through I2C serial communication. Accordingly, in the solid-state image pickup device 1, a temperature read command output from the imaging controller 210 through the input terminals of the interface 90 and the input circuit 100 is input to the sensor controller 60. The sensor controller 60 outputs a control signal representing execution of a temperature detection operation to the timing generator 50 in accordance with the temperature read command input from the imaging controller 210. Accordingly, the timing generator 50 outputs a control timing signal used for controlling a timing at which analog-to-digital conversion of the temperature detection voltage Vt output by the reference voltage generator 110 is stalled to the reference voltage generator 130 and the temperature AD conversion circuit 21. Accordingly, the reference voltage generator 130 outputs a reference voltage, and the temperature AD conversion circuit 21 performs analog-to-digital conversion of the temperature detection voltage Vt output from the reference voltage generator 110 based on the bias voltage Vb output from the bias generator 120 and the reference voltage output from the reference voltage generator 130. In addition, the timing generator 50 outputs a control timing signal used tor controlling a timing at which temperature data converted from analog to digital by the temperature AD conversion circuit 21 is read to the horizontal read controller 40. Accordingly, the horizontal read controller 40 reads the temperature data converted from analog to digital by the temperature AD conversion circuit 21 and outputs the read temperature data to the digital signal processor 70. In addition, the timing generator 50 outputs a control timing signal used for controlling a timing at which digital data processing is performed for temperature data (parallel digital data) read by the horizontal read controller 40 to the digital signal processor 70. Accordingly, the digital signal processor 70 outputs serial digital data acquired after performing digital data processing (serialization processing) for the input temperature data to the output circuit 80. Accordingly, the output circuit 80 outputs a temperature data signal corresponding to the serial digital data output from the digital signal processor 70 to the imaging controller 210 outside of the solid-state image pickup device 1 through the output terminal of the interface 90.

By controlling the operation of the solid-state image pickup device 1 at such control timings, the imaging controller 210 causes each pixel disposed in the pixel array 10 to perform exposure at the timing of an exposure control signal synchronized with the vertical synchronization signal VD, and the solid-state image pickup device 1 is controlled such that a pixel data signal corresponding to a pixel signal output from each pixel is read for each row of the pixel array 10 from a timing synchronized with the horizontal synchronization signal HD after end of the exposure period. In addition, the imaging controller 210 controls the solid-state image pickup device 1 such that it reads a temperature data signal detected based on the temperature detection voltage Vt in a period in which a pixel data signal is not read, in the timing diagram shown in FIG. 5, in the vertical blanking period in which the vertical synchronization signal VD represents no reading of a pixel data signal. Accordingly, the imaging controller 210 can acquire a temperature data signal detected by the solid-state image pickup device 1 during an exposure period having no influence on the acquisition of a pixel data signal from the solid-state image pickup device 1.

In addition, the imaging controller 210 may output a temperature read command representing detection of a temperature to the solid-state image pickup device 1 a plurality of number of times during the vertical blanking period. In this case, the imaging controller 210 can acquire temperature data signals corresponding to the number of output temperature read commands, in other words, can increase the number of samplings of temperature detection, and the temperature of the solid-state image pickup device 1 can be detected with a higher accuracy.

In addition, the imaging controller 210 may use temperature data signals in the solid-slate image pickup device 1 for correcting a pixel data signal acquired after the end of exposure in accordance with the temperature of the solid-state image pickup device 1 or may use the temperature data signals for changing the setting of the solid-state image pickup device 1 when a pixel data signal is acquired after the end of exposure. In other words, the imaging controller 210 may also perform feedback control of controlling an operation at the time of outputting a pixel data signal based on the temperature data signals acquired during an exposure period of each pixel. More specifically, the imaging controller 210 determines a voltage value of the bias voltage Vb based on the acquired temperature data signals and sets the determined voltage value, and accordingly, the temperature data signals can be used for stabilization of a conversion accuracy when the column AD conversion circuit 20 performs an analog-to-digital conversion of a pixel signal into pixel data and improvement of output performance when the output circuit 80 converts the pixel data into a differential signal and outputs the converted differential signal.

Figure 6:
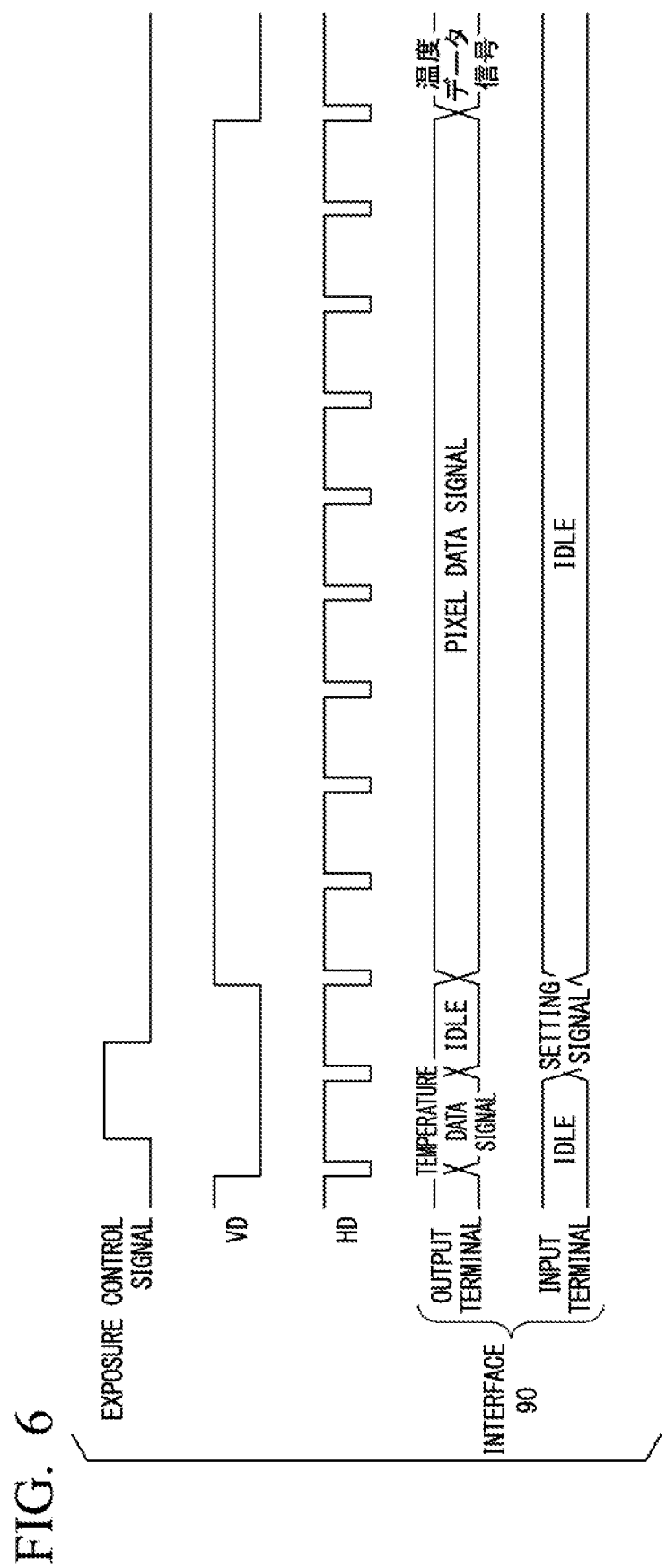
FIG. 6 is a timing diagram showing another example of signal reading timings in an image pickup apparatus in which the solid-state image pickup device according to the first embodiment of the present invention is mounted.

Here, another example of a method of controlling the solid-state image pickup device 1 in the imaging controller 210 will be described. FIG. 6 is a timing diagram showing another example of signal reading timings in an image pickup apparatus 200 in which the solid-state image pickup device 1 according to the first embodiment of the present invention is mounted. The timing diagram shown in FIG. 6, similar to the timing diagram shown in FIG. 5, illustrates control timings in a case in which the imaging controller 210 acquires a temperature data signal dining an exposure period of each pixel disposed in the pixel array 10 included in the solid-state image pickup device 1 and changes the setting of the solid-state image pickup device 1 based on the acquired temperature data signals before acquisition of a pixel data signal after the end of exposure in a case in which the image pickup apparatus 200, for example, is a system of an endoscope apparatus.

In FIG. 6, similar to the inning diagram shown in FIG. 5, an exposure control signal used for the imaging controller 210 to cause the solid-state image pickup device 1 to exposure light and a vertical synchronization signal VD and a horizontal synchronization signal HD used as references when the imaging controller 210 periodically acquires a pixel data signal and a temperature data signal from the solid-state image pickup device 1 are shown. In addition, in FIG. 6, two output terminals and input terminals inside the interface 90 are shown in a divisional manner. More specifically, two output terminals (differential signals) inside the interface 90 from which the solid-state image pickup device 1 respectively outputs a pixel data signal and a temperature data signal and two input terminals (setting signals) inside the interface 90 to which the imaging controller 210 inputs signals for changing the setting of the solid-state image pickup device 1 are shown. In addition, the timing diagram shown in FIG. 6, similar to the timing diagram shown in FIG. 5, illustrates each signal in a period in which pixel data signals corresponding to one frame are acquired.

In addition in the timing diagram shown in FIG. 6, imaging control performed by the imaging controller 210, in other words, the command signals (the imaging command and the pixel rend command) output to the solid-state image pickup device 1 and the operation of each constituent element inside the solid-state image pickup device 1 corresponding to each of the commands are similar to those shown in the timing diagram shown in FIG. 5. Thus, a detailed description for the imaging control using the imaging controller 210 shown in the timing diagram shown in FIG. 6 will be omitted. In addition, considering the entire period of the liming diagram shown in FIG. 6, a period in which the imaging controller 210 outputs command signals to two input terminals of the interface 90 is a very short period. For this reason, the period in which the imaging controller 210 outputs command signals to the two input terminals of the interface 90 is not shown in the timing diagram shown in FIG. 6. In addition, in the timing diagram shown in FIG. 6, a time during which the solid-state image pickup device 1 outputs a pixel data signal is a non-processing time during which the imaging controller 210 does not control the solid-state image pickup device 1, in other words, does not output signals to the two input terminals of the interface 90, and thus, a period of this non-processing time is denoted as an idle (IDLE) period.

In the timing diagram shown in FIG. 6, when it becomes the vertical blanking period, the imaging controller 210 outputs a temperature read command directing detection of a temperature to the two input terminals of the interface 90 of the solid-state image pickup device 1, for example, through I2C serial communication. Accordingly, the solid-state image pickup device 1 operates to be similar to the operation shown in the timing diagram shown in FIG. 5 and outputs a temperature data signal to the imaging controller 210 through the output terminal of the interface 90. In addition, considering the entire period of the timing diagram shown in FIG. 6, a period in which the imaging controller 210 outputs a temperature read command to the two input terminals of the interface 90 is a very short period. For this reason, the period in winch the imaging controller 210 outputs a temperature read command is also not shown in the timing diagram shown in FIG. 6. In addition, in the timing diagram shown in FIG. 6, a time during which the solid-state image pickup device 1 outputs a temperature data signal is also a non-processing time in winch the imaging controller 210 does not control the solid-state image pickup device 1, and thus, a period of this non-processing time is denoted as an idle (IDLE) period.

In addition, in the timing diagram shown in FIG. 6, after acquiring a temperature data signal corresponding to the output temperature read command, the imaging controller 210 outputs a setting signal representing setting and a set value of the bias voltage Vb to the two input terminals of the interface 90 of the solid-state image pickup device 1, for example, through I2C serial communication. Accordingly, in the solid-state image pickup device 1, the setting signal output from the imaging controller 210 is input to the sensor controller 60 through the input terminals of the interface 90 and the input circuit 100. The sensor controller 60 outputs a control signal representing execution of an operation of setting a voltage value of the bias voltage Vb based on the setting signal input from the imaging controller 210 to the bias generator 120. Accordingly, the bias generator 120 changes a voltage value of the bias voltage Vb to be generated based on the reference voltage Vr output from the reference voltage generator 110 to the set value output from the sensor controller 60. Thereafter, the bias generator 120 generates the bias voltage Vb of the voltage value according to the changed set value and outputs the generated bias voltage to the column AD conversion circuit 20, the temperature AD conversion circuit 21, the output circuit 80, and the reference voltage generator 130. Accordingly, each of the column AD conversion circuit 20, the temperature AD conversion circuit 21, the output circuit 80, and the reference voltage generator 130 operates similar to the operation shown in the timing diagram shown in FIG. 5 based on the bias voltage Vb of the changed voltage value output from the bias generator 120. In other words, each of the column AD conversion circuit 20, the temperature AD conversion circuit 21, the output circuit 80, and the reference voltage generator 130 performs an imaging operation or a temperature detection operation according to the control from the imaging controller 210 based on the bias voltage Vb of the set voltage value transmitted from the imaging controller 210 and outputs a pixel data signal or a temperature data signal to the imaging controller 210 outside of the solid-state image pickup device 1 through the output terminals of the interface 90.

By controlling the operation of the solid-state image pickup device 1 at such control timings, the imaging controller 210 acquires a temperature data signal during the exposure period of each pixel disposed in the pixel array 10 before acquiring a pixel data signal from the solid-state image pickup device 1. Then, the imaging controller 210 performs feedback control of controlling the operation when the solid-state image pickup device 1 outputs a pixel data signal or a temperature data signal by changing the voltage value of the bias voltage Vb based on the acquired temperature data signal. Accordingly, the imaging controller 210 can acquire a pixel data signal and a temperature data signal based on the bias voltage Vb that is feedback controlled, in other words, a pixel data signal and a temperature data signal not influenced by the temperature of the solid-state image pickup device 1.

For example, in a case in which the temperature of the solid-state image pickup device 1 a high temperature, it is assumed that the waveforms of output signals become dull, and a jitter of the clock signal increases in accordance with a change in the resistance value of a resistor configuring each circuit device. Particularly, in the solid-state image pickup device 1, parallel digital data that is converted from analog to digital and is output by each AD conversion circuit is processed to be serialized into serial digital data, and the serial digital data is output, and accordingly, it is assumed that the frequencies of pixel data signals and a temperature data signal to be output are high, and a bit error rate at the time of acquisition of pixel data signals and a temperature data signal using the imaging controller 210 increases in accordance the dullness of signal waveforms and an increase in the jitter. However, in the image pickup apparatus 200, the imaging controller 210 checks the temperature of the solid-state image pickup device 1 and sets the voltage value of the bias voltage Vb based on a temperature data signal acquired before execution of control (a pixel read command) of causing the solid-state image pickup device 1 to acquire pixel data signals, whereby the signal output capability of the output circuit 80 can be improved. Accordingly, an increase in the bit error at the time of outputting a pixel data signal and a temperature data signal using the solid-state image pickup device 1 can be inhibited. In addition, the solid-state image pickup device 1, as described above, can output a temperature data signal accurately representing the temperature of the solid-state image pickup device 1 represented by the voltage value of the temperature detection voltage Vt to the outside in a broader temperature range. For this reason, the imaging controller 210 can set a voltage value of the bias voltage Vb in a broader temperature range, and a pixel data signal and a temperature data signal corresponding to the broader temperature range can be acquired.

According to the first embodiment, an image pickup apparatus (the image pickup apparatus 200) is configured to include a solid-state image pickup device (the solid-state image pickup device 1), an exposure control device (the exposure control device 220) controlling the amount of light incident to the solid-state image pickup device 1, and an imaging controller (the imaging controller 210) outputting control signals used for controlling the exposure control device 220 and the solid-state image pickup device 1, and, a control signal output from the imaging controller 210 is input to a season controller (the sensor controller 60) in the solid-state image pickup device 1.

In this way, in the image pickup apparatus 200 in which the solid-slate image pickup device 1 according to the first embodiment is mounted, the imaging controller 210 controls the operation of the solid-state image pickup device 1, and accordingly, a temperature data signal in a state having a low influence of the temperature of the solid-state image pickup device 1, in other words, having a low degree of dependency on the temperature is acquired. Accordingly, in the image pickup apparatus 200 in which the solid-state image pickup device 1 according to the first embodiment is mounted, when the imaging controller 210 acquires a pixel data signal, the solid-state image pickup device 1 can be set to be in a state in which the influence of the temperature of the solid-state image pickup device 1 is further lowered, in other words, the degree of dependency on the temperature is further lowered.

In addition, in the image pickup apparatus 200 in which the solid-state image pickup device 1 according to the first embodiment is mounted, a configuration has been described in which, by changing the voltage value of the bias voltage Vb based on a temperature data signal acquired from the solid-state image pickup device 1 using the imaging controller 210 unit included in the image pickup apparatus 200, feedback control is performed for a pixel data signal and a temperature data signal acquired thereafter. In other words, in the image pickup apparatus 200 in which the solid-state image pickup device 1 according to the first embodiment is mounted, a configuration has been described in which feedback control is performed for a pixel data signal and a temperature data signal output by the solid-state image pickup device 1 using the imaging controller 210 disposed outside of the solid-state image pickup device 1. However, the configuration of perforating feedback control based on a temperature data signal detected by the solid-state image pickup device 1 is not limited to a configuration in which feedback control is performed by an external constituent element of the solid-state image pickup device 1 (the imaging controller 210 in the image pickup apparatus 200). For example, the solid-state image pickup device may be configured to perform feedback control based on a temperature data signal detected by the solid-state image pickup device.

Second Embodiment

Figure 7:
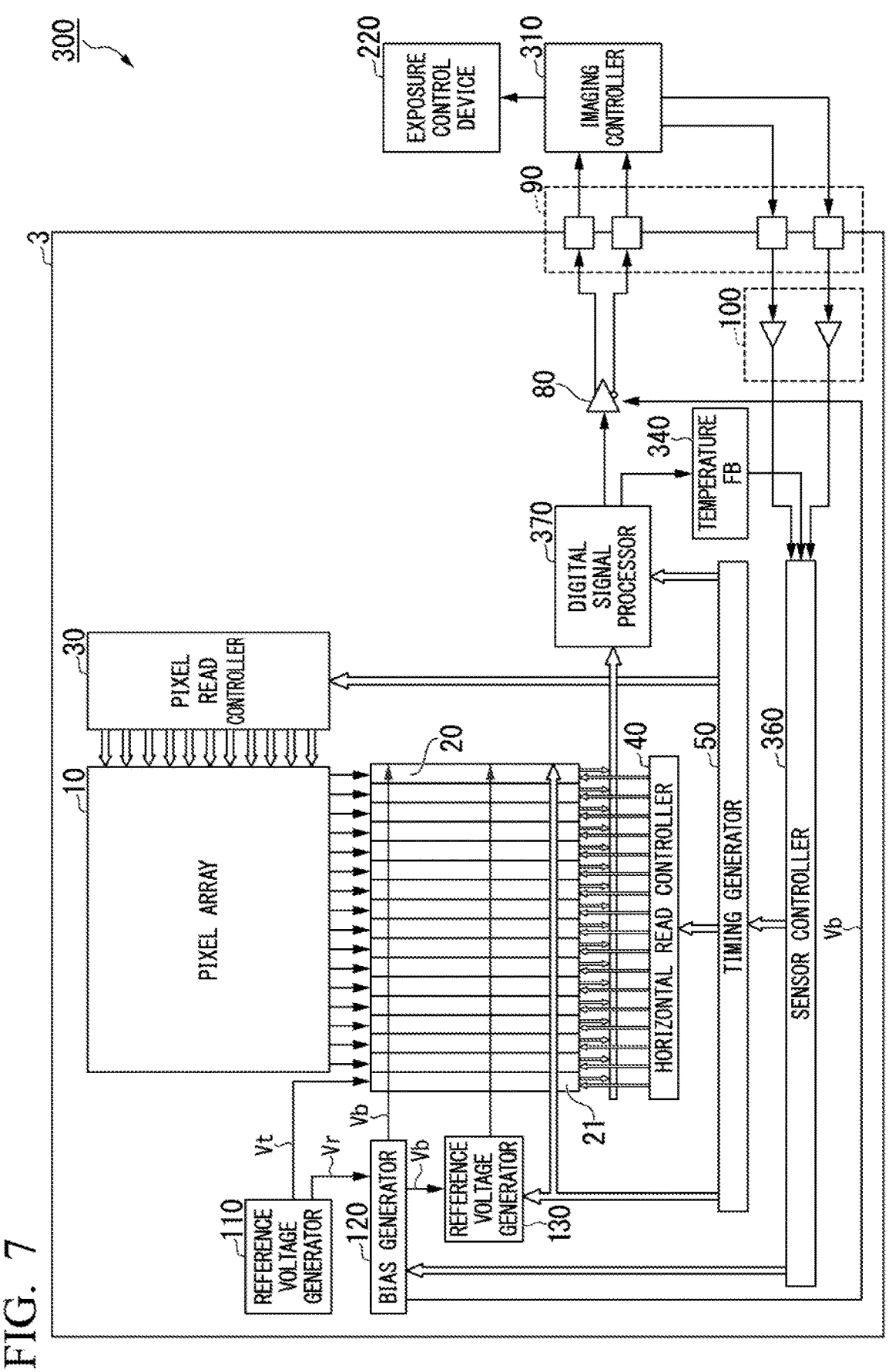
FIG. 7 is a block diagram showing a schematic configuration of an image pickup apparatus in which a solid-state image pickup device according to a second embodiment of the present invention is mounted.

Next, an image pickup apparatus in which a solid-state image pickup device according to a second embodiment is mounted will be described. FIG. 7 is a block diagram showing a schematic configuration of au image pickup apparatus in which the solid-state image pickup device according to the second embodiment of the present invention is mounted. The image pickup apparatus 300 shown in FIG. 7 includes a solid-state image pickup device 3, an imaging controller 310, and an exposure control device 220. In addition, the solid-state image pickup device 3 includes a pixel array 10, a plurality of column AD conversion circuits 20, a temperature AD conversion circuit 21, a pixel read controller 30, a horizontal read controller 40, a timing generator 50, a sensor controller 360, a digital signal processor 370, an output circuit 80, an interface 90, an input circuit 100, a reference voltage generator 110, a bias generator 120, a reference voltage generator 130, and a temperature feedback (FB) unit 310.

In addition in the constituent elements of the solid-state image pickup device 3 and the image pickup apparatus 300 shown in FIG. 7, the same constituent elements as the constituent elements of the solid-state image pickup device 1 according to the first embodiment shown in FIG. 1 and the image pickup apparatus 200 in which the solid-state image pickup device 1 according to the Gist embodiment shown in FIG. 4 is mounted are also included. Thus, the same reference numerals will be assigned to constituent elements of the solid-state image pickup device 3 and the image pickup apparatus 300 that are the same as the constituent elements of the solid-state image pickup device 1 according to the first embodiment and the image pickup apparatus 200, and a detailed description of the constituent elements will be omitted.

The solid-state image pickup device 3 is a solid-state image pickup device having a configuration in which the temperature feedback part 340 is included inside the solid-state image pickup device 1 according to the first embodiment, and feedback control based on a temperature data signal, which is performed by the imaging controller 210 of the image pickup apparatus 200 in which the solid-state image pickup device 1 according to the first embodiment is mounted, is performed by the temperature feedback part 340. In other words, the solid-state image pickup device 3 is a solid-state image pickup device having a configuration in which feedback control based on a detected temperature data signal is performed by the solid-state image pickup device 3.

For this reason, in the solid-state image pickup device 3, the sensor controller 60 included in the solid-state image pickup device 1 according to the first embodiment is substituted with the sensor controller 360, and the digital signal processor 70 is substituted with the digital signal processor 370. In addition, in the image pickup apparatus 300, the imaging controller 210 included in the image pickup apparatus 200 in winch the solid-state image pickup device 1 according to the first embodiment is mounted is substituted with the imaging controller 310.

The imaging controller 310, similar to the imaging controller 210 included in the image pickup apparatus 200 in which the solid-state image pickup device 1 according to the first embodiment is mounted, controls settings, operation timings, and the like of the solid-state image pickup device 3 and the exposure control device 220 when imaging is performed by the image pickup apparatus 300. Here, the imaging controller 310 does not perform feedback control based on a temperature data signal detected by the solid-state image pickup device 3. In addition, the other methods of controlling the solid-state image pickup device 3 in the imaging controller 310 are similar to those used by the imaging controller 210 included in the image pickup apparatus 200 in which the solid-state image pickup device 1 according to the first embodiment is mounted. Thus, a detailed description of the method of controlling the solid-state image pickup device 3 that is used by the imaging controller 310 will be omitted.

In addition, as described above, the imaging controller 310 does not perform feedback control based on a temperature data signal detected by the solid-state image pickup device 3. For this reason, the imaging controller 310 may perform control in which a command signal directing to read a temperature data signal from the solid-state image pickup device 3 is not output. In other words, the imaging controller 310 may perform control in which only an imaging command and a pixel read command are output to the solid-state image pickup device 3. Here, in a case in which the exposure control device 220 is controlled based on a temperature data signal, even in a case in which feedback control is not performed, similar to the imaging controller 210 included in the image pickup apparatus 200 in which the solid-state image pickup device 1 according to the first embodiment is mounted a temperature data signal is acquired from the solid-state image pickup device 3, and setting, operation timings, and the like of the exposure control device 220 are controlled based on the acquired temperature data signal.

The digital signal processor 370, similar to the digital signal processor 70 included in the solid-state image pickup device 1 according to the first embodiment, performs digital data processing for digital data (pixel data and temperature data) sequentially output from each of the column AD conversion circuit 20 and the temperature AD conversion circuit 21 in accordance with a control timing signal output from the timing generator 50. In addition, the digital data processing performed by the digital signal processor 370 is similar that that of the digital signal processor 70 included in the solid-state image pickup device 1 according to the first embodiment. Thus, a detailed description of the digital data processing performed by the digital signal processor 370 will be omitted. Here, the digital signal processor 370 outputs temperature data (serial digital data) after execution of the digital data processing to both the output circuit 80 and the temperature feedback part 340. In addition, the digital signal processor 370 may be configured to output temperature data (parallel digital data) output from the temperature AD conversion circuit 21 to the temperature feedback part 340 without performing digital data processing of the temperature data.

The temperature feedback part 340 determines a voltage value of the bias voltage Vb based on temperature data output from the digital signal processor 370. In addition, the method of determining a voltage value of the bias voltage Vb used by the temperature feedback part 340 is a method similar to the feedback control performed by the imaging controller 210 included in the image pickup apparatus 200 in which the solid-state image pickup device 1 according to the first embodiment is mounted. The temperature feedback part 340 outputs a feedback signal representing the determined voltage value of the bias voltage Vb to the sensor controller 360. Here, the feedback control output by the temperature feedback part 340 corresponds to a setting signal representing setting and a set value of the bias voltage Vb output by the imaging controller 210 to the solid-state image pickup device 1 at the time of performing feedback control based on a temperature data signal in the image pickup apparatus 200 in which the solid-state image pickup device 1 according to the first embodiment is mounted.

In addition, the temperature feedback part 340 may have a function of selecting whether or not the process of determining a voltage value of the bias voltage Vb is performed, in other words, selecting whether or not the function of the temperature feedback part 340 is to be stopped. The selection of whether or not the function of this temperature feedback part 340 is stopped, for example, is controlled in accordance with a control signal, which is transmitted from the sensor controller 360, according to a signal input from the outside of the solid-state image pickup device 3.

The sensor controller 360, similar to the sensor controller 60 included in the solid-state image pickup device 1 according to the first embodiment, controls the overall operation of the solid-state image pickup device 3 in accordance with a signal input from the outside of the solid-state image pickup device 3. More specifically, the sensor controller 360, similar to the sensor controller 60 included in the solid-state image pickup device 1 according to the first embodiment, outputs control signals used for controlling the operations of the timing generator 50 and the bias generator 120 included in the solid-state image pickup device 3. Here, the sensor controller 360 outputs a control signal used for controlling the operation of the bias generator 120 based on a set value of the voltage value of the bias voltage Vb represented by the feedback, signal output from the temperature feedback pail 340. In addition, the other control methods for each constituent element included in the solid-state image pickup device 3 used by the sensor controller 360 are similar to those of the sensor controller 60 included in the solid-state image pickup device 1 according to the first embodiment. Thus, a detailed description of a method of controlling each constituent element that is used by the sensor controller 360 will be omitted.

In addition, the sensor controller 360, similar to the sensor controller 60 included in the solid-state image pickup device 1 according to the first embodiment, may have a function of controlling a voltage value of the bias voltage Vb generated by the bias generator 120 in accordance with a setting signal input from the outside of the solid-state image pickup device 3. In such a case, a function of switching between controlling a voltage value of the bias voltage Vb generated by the bias generator 120 based on a feedback signal output from the temperature feedback part 340 and controlling the voltage value in accordance with a setting signal input from the outside of the solid-state image pickup device 3 may be included.

In addition, the feedback control performed by the solid-state image pickup device 3 is performed at the same timing as a timing at which a setting signal representing setting and a set value of the bias voltage Vb is input to the solid-state image pickup device 1 by the imaging controller 210 in a signal read timing of the image pickup apparatus 200 in which the solid-state image pickup device 1 according to the first embodiment shown in FIG. 6 is mounted. In other words, by regarding a timing of two input terminals (setting signals) inside the interface 90 in the signal reading timing shown in FIG. 6 as a control timing for feedback control performed by the solid-state image pickup device 3, the process can be easily understood. Thus, a detailed description of control timings of the feedback control in the solid-slate image pickup device 3 will be omitted.

According to the second embodiment, a solid-state image pickup device (the solid-state image pickup device 3) is configured which includes a temperature feedback part (the temperature feedback pail 340) that outputs a feedback signal for changing the settings of a timing generator (the timing generator 50) and a bias generator (the bias generator 120) based on a voltage value of a temperature detection voltage (the temperature detection voltage Vt) to a sensor controller (the sensor controller 360).

In accordance with such a configuration, the solid-state image pickup device 3 according to the second embodiment, similar to the solid-state image pickup device 1 according to the first embodiment, also can output a pixel data signal in a state having a tow influence of the temperature of the solid-state image pickup device 3, in other words, having a low degree of dependency on the temperature. In addition, the solid-state image pickup device 3 according to the second embodiment, similar to the solid-state image pickup device 1 according to the first embodiment, also can output a temperature data signal in a state having a low influence of the temperature of the solid-state image pickup device 3 (having a low degree of dependency on the temperature). In other words, similar to the solid-state image pickup device 1 according to the first embodiment, even in a case in which the temperature of the solid-state image pickup device 3 greatly changes, the solid-state image pickup device 2 according to the second embodiment can output a temperature data signal accurately representing the temperature of the solid-slate image pickup device 3 (semiconductor substrate) represented by the voltage value of the temperature detection voltage Vt.

In addition, the solid-state image pickup device 3 according to the second embodiment includes the temperature feedback part 340 that determines a voltage value of the bias voltage Vb based on the detected temperature data. Accordingly, the solid-state image pickup device 3 according to the second embodiment can perform feedback control based on a detected temperature data signal using the solid-state image pickup device 3. Accordingly, the solid-state image pickup device 3 can output a pixel data signal in a state in which the influence of the temperature of the solid-state image pickup device 3 is decreased, in other words, the degree of dependency on the temperature is decreased.

In this way, also according to the image pickup apparatus 300 in which the solid-state image pickup device 3 according to the second embodiment is mounted, effects that are similar to those of the image pickup apparatus 200 in which the solid-state image pickup device 1 according to the first embodiment is mounted can be acquired.

In addition, in the solid-state image pickup device 3 according to the second embodiment, a configuration in which the temperature feedback part 340 determines a voltage value of the bias voltage Vb based on temperature data (serial digital data) output from the digital signal processor 370 has been described. However, a configuration in winch the temperature feedback part 340 determines a voltage value of the bias voltage Vb based on temperature data (parallel digital data) that has been converted from analog to digital by the temperature AD conversion circuit 21 may be employed.

In addition, in the solid-state image pickup device 1 according to the first embodiment and the solid-state image pickup device 3 according to the second embodiment, a configuration in which terminals configuring the interface 90 are terminals corresponding to one of input or output of signals, in other words, an input terminal or an output terminal has been described. However, in order to achieve a decrease in the size of the solid-state image pickup device 1 or the solid-state image pickup device 3, in other words, a decrease in the size of the semiconductor substrate (a projection area) forming the solid-state image pickup device, the number of terminals configuring the interface 90 may be decreased.

Third Embodiment

Figure 8:
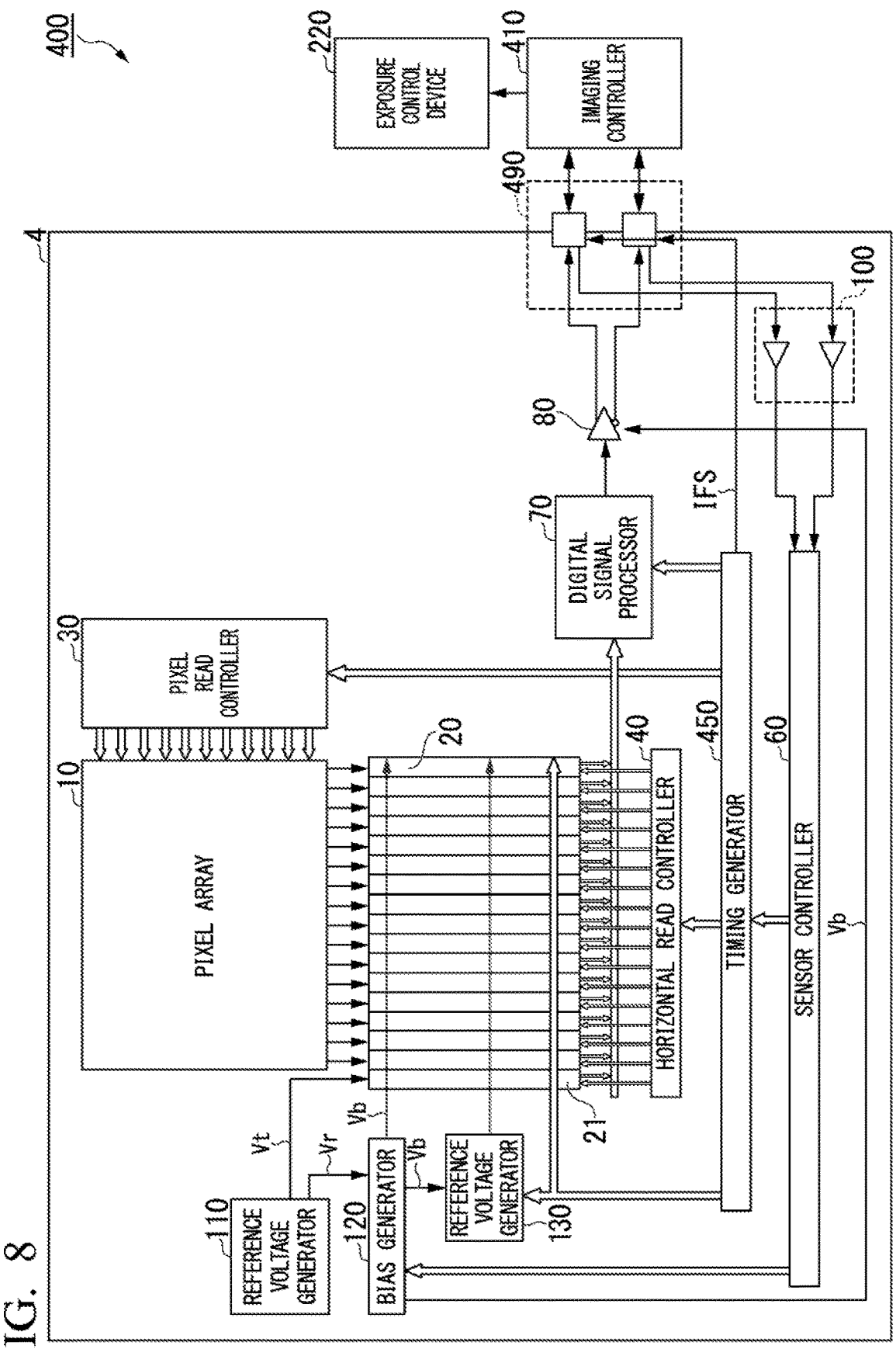
FIG. 8 is a block diagram showing a schematic configuration of an image pickup apparatus in which a solid-state image pickup device according to a third embodiment of the present invention is mounted.

Next, an image pickup apparatus in which a solid-state image pickup device according to a third embodiment is mounted will be described. FIG. 8 is a block diagram showing a schematic configuration of an image pickup apparatus in which a solid-state image pickup device according to a thud embodiment of the present invention is mounted. The image pickup apparatus 400 shown in FIG. 8 includes a solid-state image pickup device 4, an imaging controller 410, and an exposure control device 220. In addition, the solid-state image pickup device 4 includes a pixel array 10, a plurality of column AD conversion circuits 20, a temperature AD conversion circuit 21, a pixel read controller 30, a horizontal read controller 40, a timing generator 450, a sensor controller 60, a digital signal processor 70, an output circuit 80, an interface 490, an input circuit 100, a reference voltage generator 110, a bias generator 120, and a reference voltage generator 130.

In addition, in the constituent elements of the solid-state image pickup device 4 and the image pickup apparatus 400 shown in FIG. 8, the same constituent elements as the constituent elements of the solid-state image pickup device 1 according to the first embodiment shown in FIG. 1 and the image pickup apparatus 200 in which the solid-state image pickup apparatus 200 in which the solid-state image pickup device 1 according to the first embodiment shown in FIG. 4 is mounted are also included. Thus, the same reference numerals will be assigned to constituent elements of the solid-state image pickup device 4 and the image pickup apparatus 400 that are the same as the constituent elements of the solid-state image pickup device 1 according to the first embodiment and the image pickup apparatus 200, and a detailed description of the constituent elements will be omitted.

The solid-state image pickup device 4 is a solid-state image pickup device having a confirmation in which the number of terminals configuring the interface 90 included in the solid-state image pickup device 1 according to the first embodiment shown in FIG. 1 is decreased. In other words, the solid-state image pickup device 4 is a solid-state image pickup device achieving a decrease in the size of the solid-state image pickup device 1 according to the first embodiment.

For this reason, in the solid-state image pickup device 4, the timing generator 50 included in the solid-state image pickup device 1 according to the first embodiment is substituted with the timing generator 450, and the interface 90 is substituted with the interface 490. In addition, in the image pickup apparatus 400, the imaging controller 210 included in the image pickup apparatus 200 in which the solid-state image pickup device 1 according to the first embodiment is mounted is substituted with the imaging controller 410.

The imaging controller 410, similar to the imaging controller 210 included in the image pickup apparatus 200 in which the solid-state image pickup device 1 according to the first embodiment is mounted, controls settings, operation timings, and the like of the solid-state image pickup device 4 and the exposure control device 220 when imaging is perforated by the image pickup apparatus 400. Here, a signal line of the imaging controller 410 used for a connection with the solid-state image pickup device 4 is a bi-directional signal line. In addition, a system of signals exchanged between the imaging controller 410 and the solid-state image pickup device 4 is similar to that of the imaging controller 210 included in the image pickup apparatus 200 in which the solid-state image pickup device 1 according to the first embodiment is mounted. More specifically, the imaging controller 410 receives inputs of a pixel data signal and a temperature data signal using differential signals of the LVDS system and outputs a command signal, a netting signal, and the like used for controlling the operation of the solid-state image pickup device 4 through I2C serial communication. In addition, a method of controlling the solid-state image pickup device 4 that is used by the imaging controller 410 is similar to the imaging controller 210 included in the image pickup apparatus 200 is which the solid-state image pickup device 1 according to the first embodiment is mounted. Thus, a detailed description of the method of controlling the solid-state image pickup device 4 in the imaging controller 410 will be omitted.

More specifically, the timing generator 450, similar to the timing generator 50 included in the solid-state image pickup device 1 according to the first embodiment, generates a control timing signal controlling timings at which each constituent element included in rite solid-state image pickup device 4 operates and outputs the generated control timing signal to each constituent element included in the solid-state image pickup device 4 in accordance with control from the sensor controller 60. More specifically, the timing generator 450, similar to the timing generator 50 included in the solid-state image pickup device 1 according to the first embodiment, generates and outputs control timing signals controlling operation timings of the column AD conversion circuit 20, the temperature AD conversion circuit 21, the pixel read controller 30, the horizontal read controller 40, the digital signal processor 70, and the reference voltage generator 130 included in the solid-state image pickup device 4. In addition, control timing signals output to the column AD conversion circuit 20, the temperature AD conversion circuit 21, the pixel read controller 30, the horizontal read controller 40, the digital signal processor 70, and the reference voltage generator 130 by the timing generator 450 are similar to those output by the timing generator 50 included in the solid-state image pickup device 1 according to the first embodiment. Thus, a detailed description of the control timing signals output by the timing generator 450 will be omitted.

In addition, in addition to the control timing signals output by the timing generator 50 included in the solid-state image pickup device 1 according to the first embodiment, the timing generator 450 outputs an interface switching signal used for switching between an operation in an input mode in which terminals of the interfaces 490 are set as input terminals and an operation in an output mode in which the terminals are set as output terminals to each terminal of the interface 490.

More specifically, when the output circuit 80 outputs a pixel data signal or a temperature data signal to the outside of the solid-state image pickup device 4, the timing generator 450 sets the interface switching signal IFS to be in a state representing that each terminal of the interface 490 operates in the output mode. In addition, at a time other than when the output circuit 80 outputs a pixel data signal or a temperature data signal to the outside of the solid-state image pickup device 4, the timing generator 450 sets the interface switching signal IFS to be in a state representing that each terminal of the interface 490 operates in the input mode. Accordingly, in a period other than a period in which the solid-state image pickup device 4 outputs a pixel data signal or a temperature data signal, each terminal included in the interface 490 is set to be in a state in which the imaging controller 410 that is externally provided receives input of a command signal, a setting signal, or the like used for controlling the operation of the solid-state image pickup device 4.

The interface 490, similar to the interface 90 included in the solid-state image pickup device 1 according to the first embodiment, is a terminal used for connecting the solid-state image pickup device 4 and the outside. The terminals configuring the interface 490 are input/output terminals. In other words, bi-directional terminals. The terminals configuring the interface 490 are controlled to operate as a terminal having one function of the input terminals and the output terminals in accordance with the interlace switching signal IFS output from the timing generator 450. In the solid-state image pickup device 4, by configuring two output terminals used for outputting each differential signal (a pixel data signal and a temperature data signal) output by the output circuit 80 to the outside and two input terminals used for inputting signals from the outside to the solid-state image pickup device 4 to be shared the size (the projection area) of the semiconductor substrate forming the solid-state image pickup device 4 becomes smaller than that of the solid-state image pickup device 1 according to the first embodiment.

Figure 9:
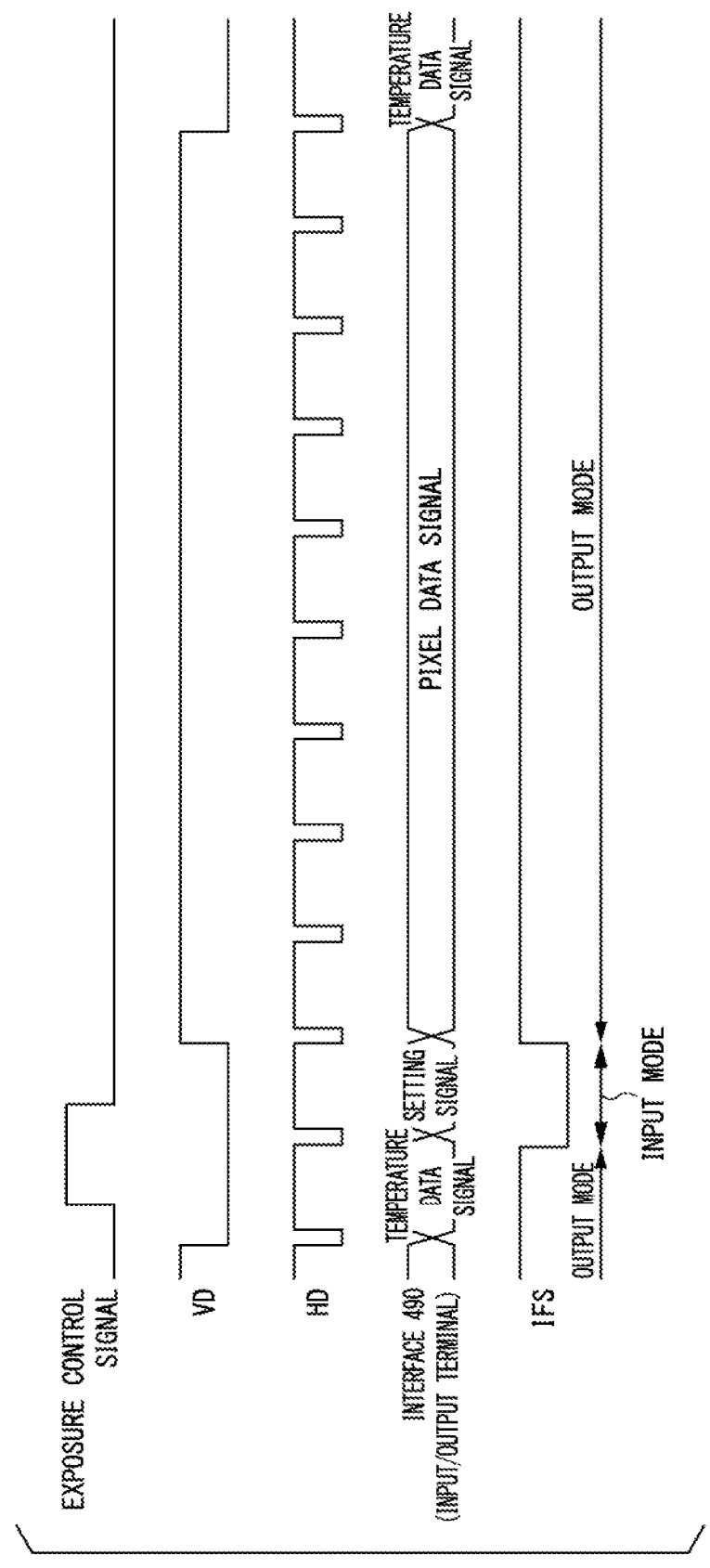
FIG. 9 is a timing diagram showing one example of signal switching timings in the solid-state image pickup device according to the third embodiment of the present invention.

Here, one example of switching between input and output of the interface 490 included m the solid-state image pickup device 4, in other words, switching timings between the input mode and the output mode will be described. FIG. 9 is a timing diagram showing one example of signal switching timings in the solid-state image pickup device 4 according to the third embodiment of the present invention. FIG. 9, similar to feedback control performed by the image pickup apparatus 200 in which the solid-state image pickup device 1 according to the first embodiment shown in FIG. 6 is mounted, illustrates one example of control timings in a case in which the imaging controller 410 performs feedback control, for example, in a case in which the image pickup apparatus 400 in which the solid-state image pickup device 4 is mounted is a system of an endoscope apparatus.

Also in the timing diagram shown in FIG. 9, similar to the timing diagram shown in FIG. 6, the imaging controller 410 performs feedback control of acquiring a temperature data signal during an exposure period of each pixel disposed in the pixel array 10 included in the solid-state image pickup device 4 and changing the selling of the solid-state image pickup device 4 based on the acquired temperature data signals before acquisition of a pixel data signal after the end of exposure.

In FIG. 9, similar to the timing diagram shown in FIG. 6, an exposure control signal used for the imaging controller 410 to cause the solid-state image pickup device 4 to exposure light and a vertical synchronization signal VD and a horizontal synchronization signal HD used as references when the imaging controller 410 periodically acquires a pixel data signal and a temperature data signal from the solid-state image pickup device 4 are shown. In addition, in FIG. 9, signals of two input/output terminals inside the interlace 490 and an interface switching signal IFS output by the timing generator 450 are shown. In addition, FIG. 9 illustrates that, when the interface switching signal IFS is in the "High level", the output mode is set, and, when the interface switching signal IFS is in the "Low" level, the input mode is set.

In addition, in the timing diagram shown in FIG. 9, imaging control performed by the imaging controller 410, in other words, each command signal (an imaging command and a pixel read command) output to the solid-state image pickup device 4 and the operation of each constituent element inside the solid-state image pickup device 4 according to each command signal are similar to those in the timing diagram shown in FIG. 6. In addition, in the timing diagram shown in FIG. 9, an operation of feedback control controlling an operation when the imaging controller 410 changes a voltage value of the bias voltage Vb based on the acquired temperature data signal, and the solid-state image pickup device 4 outputs a pixel data signal or a temperature data signal is also similar to the operation described in the timing diagram shown in FIG. 6. Thus, a detailed description of imaging control and feedback control performed by the imaging controller 410 shown in the timing diagram shown in FIG. 9 will be omitted. In addition, also in the timing diagram shown in FIG. 9, similar to the timing diagram shown in FIG. 6, in a case in which the entire period is considered, a period in which the imaging controller 410 outputs each command signal when two input/output terminals of the interface 490 are in the input mode is a very short period. For this reason, also in the timing diagram shown in FIG. 9, similar to the timing diagram shown in FIG. 6, a period in which the imaging controller 410 outputs each command signal when the two input/output terminals of the interface 490 are in the input mode is not shown.

In the timing diagram shown in FIG. 9, when it becomes the vertical blanking period, the imaging controller 410 outputs a temperature read command directing detection of a temperature for example, through I2C serial communication when the two input/output terminals of the interface 490 of the solid-state image pickup device 4 are in the input mode. Accordingly, in the solid-state image pickup device 4, the timing generator 450 sets the interface switching signal IFS to be in a state ("High" level) representing an operation in the output mode. Accordingly, each input/output terminal of the interface 490 operates as an output terminal, and each constituent element included in the solid-state image pickup device 4 operates similar to the operation shown in the timing diagram shown in FIG. 6, and a temperature data signal is output to the imaging controller 410 through the input/output terminal of the interface 490. In addition, also in the timing diagram shown in FIG. 9, similar to the timing diagram shown in FIG. 6, in a case in which the entire period is considered, a period in which the imaging controller 410 outputs a temperature read command when two input/output terminals of the interface 490 are in the input mode is a very short period. For this reason, also in the timing diagram shown in FIG. 9, similar to the timing diagram shown in FIG. 6, a period in which the imaging controller 410 outputs a temperature read command when the two input/output terminals of the interface 490 are in the input mode is not shown.

In addition, in the timing diagram shown in FIG. 9, in the solid-state image pickup device 4, when the output of a temperature data signal according to a temperature read command from the imaging, controller 410 ends, the timing generator 450 sets the interface switching signal IFS to be in a state ("Low level") representing an operation in the input mode. Accordingly, each input/output terminal of the interface 490 operates as an input terminal. Then, in the timing diagram shown in FIG. 9, after acquiring a temperature data signal corresponding to the output temperature read command, the imaging controller 410 outputs a setting signal representing setting and a set value of the bias voltage Vb to the two input/output terminals of the interface 490 of the solid-slate image pickup device 4, for example, through I2C serial communication. Accordingly, in the solid-state image pickup device 4, the setting signal output from the imaging controller 410 is input to the sensor controller 60 through the input/output terminal of the interface 490 and the input circuit 100. Accordingly, each constituent element included in the solid-state image pickup device 4 operates similar to the operation shown in the timing diagram shown in FIG. 6, changes the voltage value of the bias voltage Vb to a voltage value of a set value set by the imaging controller 410, and thereafter, operates based on the bias voltage Vb of the changed voltage value.

Thereafter, when the vertical synchronization signal VD comes into a period ("High" level) in which a pixel data signal is read, the imaging controller 410 outputs a pixel read command directing to read and output pixel data signals for each row from the pixel array 10 at a timing synchronized with the horizontal synchronization signal HD to two input/output terminals (the input mode) of the interface 490 of the solid-state image pickup device 4, for example, through I2C serial communication. Accordingly, in the solid-state image pickup device 4, the timing generator 450 sets the interface switching signal IFS to be in a state ("High" level) representing an operation in the output mode. Accordingly, each input/output terminal of the interface 490 operates as an output terminal. Then, each constituent element included in the solid-state image pickup device 4 operates similar to the operation shown in the timing diagram shown in FIG. 6 and outputs a pixel data signal to the imaging controller 410 through the input/output terminal of the interface 490. In addition, also in the timing diagram shown in FIG. 9, similar to the timing diagram shown in FIG. 6, in a case in which the entire period is considered, a period in which the imaging controller 410 outputs a pixel read command when two input/output terminals of the interface 490 are in the input mode is a very short period. For this reason, also in the timing diagram shown in FIG. 9, similar to the timing diagram shown in FIG. 6, a period in which the imaging controller 410 outputs a pixel read command when the two input/output terminals of the interface 490 are in the input mode is not shown.

In such a switching timing, the solid-state image pickup device 4 performs an operation corresponding to a command signal or a setting signal input from the imaging controller 410. Accordingly, the imaging controller 410 performs feedback control of acquiring a temperature data signal during an exposure period of each pixel disposed in the pixel array 10 before acquisition of a pixel data signal from the solid-state image pickup device 4 and changing the voltage value of the bias voltage Vb. Accordingly, the imaging controller 410, similar to feedback control of the image pickup apparatus 200 in which the solid-state image pickup device 1 according to the first embodiment shown in FIG. 6 is mounted, can acquire a pixel data signal and a temperature data signal based on the bias voltage Yb that is feedback controlled, in other words, a pixel data signal and a temperature data signal not influenced by the temperature of the solid-state image pickup device 4.

According to the third embodiment, a solid-state image pickup device (the solid-state image pickup device 4) is configured which includes an output circuit (the digital signal processor 70, the output circuit 80, and the interface 490) including an interface (the interface 490) capable of switching between an output mode in which both the photoelectric conversion signal and the temperature detection voltage (the temperature detection voltage Vt) are output to the outside and an input mode in which a signal from the outside is input to a sensor controller (the sensor controller 60).

In addition, according to the third embodiment, the solid-state image pickup device 4 is configured in which the sensor controller 60 performs control of a timing generator (the timing generator 450) such that switching between the output mode and the input mode in the interface 490 is performed before output of a photoelectric conversion signal is stalled after the end of the output of the temperature detection voltage Vt.

In addition, according to the third embodiment, an image pickup apparatus (the image pickup apparatus 400) is configured in which the solid-state image pickup device 4, an exposure control device (the exposure control device 220) controlling the amount of light incident to the solid-state image pickup device 4, and an imaging controller (the imaging controller 410) outputting control signals used for controlling the exposure control device 220 and the solid-state image pickup device 4 are included, and, a control signal output from the imaging controller 410 is input to a sensor controller (the sensor controller 60) in the input mode in the solid-state image pickup device 4.

In accordance with such a configuration, the solid-state image pickup device 4 according to the third embodiment, similar to the solid-state image pickup device 1 according to the first embodiment, also can output a pixel data signal in a state having a low influence of the temperature of the solid-slate image pickup device 4, in other words, having a low degree of dependency on the temperature. In addition, the solid-state image pickup device 4 according to the third embodiment, similar to the solid-state image pickup device 1 according to the first embodiment, also can output a temperature data signal in a state having a low influence of the temperature of the solid-state image pickup device 4 (having a low degree of dependency on the temperature). In other words, similar to the solid-state image pickup device 1 according to the first embodiment, even in a case in which the temperature of the solid-state image pickup device 4 greatly changes, the solid-state image pickup device 4 according to the third embodiment also can output a temperature data signal accurately representing the temperature of the solid-state image pickup device 4 (semiconductor substrate) represented by the voltage value of the temperature detection voltage Vt.

In addition, the solid-state image pickup device A according to the third embodiment sets terminals included in the interface 490 as input/output terminals, and the timing generator 450 causes the input output terminals to be switched between an operation as input terminals and an operation as output terminals. More specifically, in the solid-state image pickup device 4 according to the third embodiment, the timing generator 450 sets the output mode in which each input/output terminal included in the interface 490 operates as an output terminal only when a pixel data signal or a temperature data signal is output and sets the input mode in winch each input output terminal included in the interface 490 is operated as an input terminal otherwise. Accordingly, in the solid-state image pickup device 4 according to the third embodiment, the number of input/output terminals included in the interface 490 is decreased, and a decrease in the size of the solid-state image pickup device 4 can be achieved.

In this way, also according to the image pickup apparatus 400 in winch the solid-state image pickup device 4 according to the third embodiment is mounted, effects that are similar to those of the image pickup apparatus 200 in which the solid-state image pickup device 1 according to the first embodiment is mounted can be acquired. For example, also in the image pickup apparatus 400 in which the solid-state image pickup device 4 according to the third embodiment is mounted, the imaging controller 410 controls the operation of the solid-state image pickup device 4, and accordingly, similar to the image pickup apparatus 200 in which the solid-state image pickup device 1 according to the first embodiment is mounted, feedback control can be performed for a pixel data signal and a temperature data signal.

In addition, in the third embodiment, the solid-state image pickup device 4 having a configuration in which the number of terminals configuring the interface 90 included in the solid-state image pickup device 1 according to the first embodiment shown in FIG. 1 is decreased is shown. Thus, the number of terminals configuring the interface 90 included in the solid-state image pickup device 3 according to the second embodiment can be decreased, in other words, a decrease in the size of the solid-state image pickup device 3 according to the second embodiment can be achieved. The configuration and the operation of this case may be assumed to be similar to those in the case in which a decrease in size of the solid-state image pickup device 1 according to the first embodiment described in the third embodiment is achieved. Thus, a detailed description of the configuration and the operation in a case in which a decrease in size of the solid-state image pickup device 3 according to the second embodiment is achieved will be omitted.

As described above, according 10 each embodiment of the present invention, a reference voltage generator is included which generates a reference voltage of a voltage value, of which the temperature coefficient is almost zero, not depending on the temperature of the solid-state image pickup device (not influenced by the temperature of the solid-state image pickup device) and a temperature detection voltage of a voltage value changing in accordance with the temperature of the solid-state image pickup device (having a temperature coefficient corresponding to the temperature). Then, in each embodiment of the present invention, on a bias voltage that is generated based on the reference voltage generated by the reference voltage generator, the column AD conversion circuit, the output circuit, and the reference voltage generator (constituent elements of an analog system) included in the solid-state image pickup device operate. Accordingly, in each embodiment of the present invention, a pixel signal can be output in a state having a low influence of the temperature of the solid-state image pickup device, in other words, having a low degree of dependency on the temperature.

In addition, in each embodiment of the present invention, a temperature AD conversion circuit converting a temperature detection voltage generated by the reference voltage generator from analog to digital as a temperature signal is included. Accordingly, in each embodiment of the present invention, the temperature of the solid-state image pickup device can be detected based on the voltage value of the temperature detection voltage generated by the reference voltage generator. In addition, in each embodiment of the present invention, the temperature AD conversion circuit also operates based on the bias voltage generated from the reference voltage generated by the reference voltage generator and the reference voltage. Accordingly, in each embodiment of the present invention, even in a ease in which the temperature of the solid-state image pickup device greatly varies, the temperature of the solid-state image pickup device is detected in a broad temperature range, and a temperature signal accurately representing the temperature of the solid-state image pickup device (semiconductor substrate) represented by the voltage value of the temperature detection voltage in a state having a low degree of dependency on the temperature, in other words, having a low influence of the temperature of the solid-state image pickup device can be output.

Accordingly, in each embodiment of the present invention, in an image pickup apparatus in which a solid-state image pickup device is mounted, a temperature signal in a state having a low influence of the temperature of the solid-state image pickup device, in other words, having a low degree of dependency on the temperature can be acquired. Then, in each embodiment of the present invention, feedback control controlling the operation of the solid-state image pickup device at the time of outputting a pixel signal is performed based on the acquired temperature signal. More specifically, in each embodiment of the present invention, information of an acquired temperature signal is fed back to the voltage value of the bias voltage generated from the reference voltage. Accordingly, in each embodiment of the present invention, constituent elements of the analog system within the solid-state image pickup device can lie operated in a state having a low influence of the temperature of the solid-state image pickup device such as a state in which conversion accuracy of analog-to-digital conversion is stabilized in the column AD conversion circuit and the temperature AD conversion circuit and the output capability at the time of outputting a signal using the output circuit is improved.

In addition, a specific configuration of the present invention is not limited to each embodiment of the present invention, and various changes in a range not departing from the concept of the present invention are also included therein. For example, in each embodiment of the present invention, a configuration in which an AD conversion circuit as a constituent element of the analog system is included in the solid-state image pickup device is shown. However, additionally, as constituent elements of the analog system included in the solid-state image pickup device, there are a column signal processor that performs a correlated double sampling (CDS) process of suppressing noise of pixel signals (analog signal) output from pixels of a corresponding column disposed in the pixel array 10 and the like. Also such constituent elements of the analog system are operated using a voltage generated from the reference voltage generated by the reference voltage generator and accordingly, can be operated in a state having a low influence of the temperature of the solid-state image pickup device, and stabilization of characteristics can be achieved. In addition, in each embodiment of the present invention, although the configuration of an image pickup apparatus including a solid-state image pickup device, an imaging controller, and an exposure control device has been shown, specific constituent elements included in the image pickup apparatus are not limited to those of each embodiment of the present invention.

While preferred embodiments of the present invention have been described above, the present invention is not limited to these embodiments and modified examples thereof. Additions, omissions, substitutions, and oilier modifications can be made without departing from the spirit or scope of the present invention.

In addition, the present invention is not to be considered as being limited by the foregoing description, and is only limited by the scope of the appended claims.

According to each embodiment described above, a solid-state image pickup device capable of outputting a temperature signal representing an accurate temperature detected in a broad temperature range from a circuit device that is commonly used for a pixel signal and an image pickup apparatus using this solid-state image pickup device can be provided.

What is claimed is:

1. A solid-state image pickup device comprising:
   a pixel array in which a plurality of pixels each outputting a photoelectric conversion signal corresponding to an amount of incident light are disposed in a matrix pattern;
   a reference voltage generator configured to generate a temperature detection voltage changing in accordance with a change in temperature and a reference voltage not depending on a change in temperature;
   a read circuit configured to perform signal processing of the photoelectric conversion signal output by the pixel array and the temperature detection voltage generated by the reference voltage generator and read the photoelectric conversion signal and the temperature detection voltage that are processed;
   an output circuit configured to output both the photoelectric conversion signal and the temperature detection voltage for which the signal processing has been performed by the read circuit to the outside;
   a bias generator configured to generate a bias voltage based on the reference voltage and supply the bias voltage to both the read circuit and the output circuit;
   a timing generator configured to control a timing for reading the photoelectric conversion signal from the pixel array and a timing for the signal processing performed by the read circuit and reading the photoelectric conversion signal and the temperature detection voltage for which the signal processing has been performed; and
   a sensor controller configured to control the timing generator and the bias generator.

2. The solid-state image pickup device according to claim 1, wherein
   the read circuit includes an AD conversion circuit configured to convert an input analog signal into a digital signal and output the converted digital signal, and
   the output circuit serializes the digital signal and outputs the serialized digital signal as a differential signal.

3. The solid-state image pickup device according to claim 1, further comprising:
   a temperature feedback circuit configured to output a feedback signal used for changing settings of the timing generator and the bias generator to the sensor controller based on a value of the temperature detection voltage.

4. The solid-state image pickup device according to claim 1, wherein the output circuit includes an interface configured to be capable of switching between an output mode in which both the photoelectric conversion signal and the temperature detection voltage are output to the outside and an input mode in which a signal from the outside is input to the sensor controller.

5. The solid-state image pickup device according to claim 4, wherein the sensor controller performs control of the timing generator such that the switching between the output mode and the input mode in the interface is performed before the output of the photoelectric conversion signal starts after end of the output of the temperature detection voltage.

6. An image pickup apparatus comprising:
   a solid-state image pickup device;
   an exposure control device configured to control the amount of light incident to the solid-state image pickup device; and
   an imaging controller configured to output a control signal used for controlling the exposure control device and the solid-state image pickup device,
   wherein the solid-state image pickup device includes:
      a pixel array in which a plurality of pixels each outputting a photoelectric conversion signal corresponding to an amount of incident light are disposed in a matrix pattern;
      a reference voltage generator configured to generate a temperature detection voltage changing in accordance with a change in temperature and a reference voltage not depending on a change in temperature;
      a read circuit configured to perform signal processing of the photoelectric conversion signal output by the pixel array and the temperature detection voltage generated by the reference voltage generator and read the photoelectric conversion signal and the temperature detection voltage that are processed;
      an output circuit configured to output both the photoelectric conversion signal and the temperature detection voltage for which the signal processing has been performed by the read circuit to the outside;
      a bias generator configured to generate a bias voltage based on the reference voltage and supply the bias voltage to both the read circuit and the output circuit;
      a timing generator configured to control a timing for reading the photoelectric conversion signal from the pixel array and a timing for the signal processing performed by the read circuit and reading the photoelectric conversion signal and the temperature detection voltage for which the signal processing has been performed; and
      a sensor controller configured to control the timing generator and the bias generator,
   wherein the control signal output from the imaging controller is input to the sensor controller.

7. An image pickup apparatus comprising:
   a solid-state image pickup device;
   an exposure control device configured to control the amount of light incident to the solid-state image pickup device; and
   an imaging controller configured to output a control signal used for controlling the exposure control device and the solid-state image pickup device,
   wherein the solid-state image pickup device includes:
      a pixel array in which a plurality of pixels each outputting a photoelectric conversion signal corresponding to an amount of incident light are disposed in a matrix pattern;
      a reference voltage generator configured to generate a temperature detection voltage changing in accordance with a change in temperature and a reference voltage not depending on a change in temperature;
      a read circuit configured to perform signal processing of the photoelectric conversion signal output by the pixel array and the temperature detection voltage generated by the reference voltage generator and read the photoelectric conversion signal and the temperature detection voltage that are processed;
      an output circuit configured to output both the photoelectric conversion signal and the temperature detection voltage for which the signal processing has been performed by the read circuit to the outside;

a bias generator configured to generate a bias voltage based on the reference voltage and supply the bias voltage to both the read circuit and the output circuit;

a timing generator configured to control a timing for reading the photoelectric conversion signal from the pixel array and a timing for the signal processing performed by the read circuit and reading the photoelectric conversion signal and the temperature detection voltage for which the signal processing has been performed; and a sensor controller configured to control the timing generator and the bias generator, wherein the output circuit includes an interface configured to be capable of switching between an output mode in which both the photoelectric conversion signal and the temperature detection voltage are output to the outside and an input mode in which a signal from the outside is input to the sensor controller, wherein, in the input mode, the control signal output from the imaging controller is input to the sensor controller.

8. The image pickup apparatus according to claim 7, wherein the sensor controller performs control of the timing generator such that the switching between the output mode and the input mode in the interface is performed before the output of the photoelectric conversion signal starts after end of the output of the temperature detection voltage.

* * * * *